(12) United States Patent
Nakamura et al.

(10) Patent No.: US 11,907,017 B2
(45) Date of Patent: Feb. 20, 2024

(54) DISPLAY DEVICE

(71) Applicant: Semiconductor Energy Laboratory Co., Ltd., Kanagawa-ken (JP)

(72) Inventors: Daiki Nakamura, Kanagawa (JP); Kazuhiko Fujita, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 122 days.

(21) Appl. No.: 17/270,574

(22) PCT Filed: Aug. 21, 2019

(86) PCT No.: PCT/IB2019/057030
§ 371 (c)(1),
(2) Date: Feb. 23, 2021

(87) PCT Pub. No.: WO2020/044171
PCT Pub. Date: Mar. 5, 2020

(65) Prior Publication Data
US 2021/0191468 A1    Jun. 24, 2021

(30) Foreign Application Priority Data
Aug. 31, 2018  (JP) .................................. 2018-163032

(51) Int. Cl.
*G06F 1/16* (2006.01)
*G02B 1/14* (2015.01)
(Continued)

(52) U.S. Cl.
CPC ............. *G06F 1/1652* (2013.01); *G02B 1/14* (2015.01); *G06F 1/1616* (2013.01); *G06F 3/0412* (2013.01); *G09F 9/301* (2013.01)

(58) Field of Classification Search
CPC combination set(s) only.
See application file for complete search history.

(56) References Cited

U.S. PATENT DOCUMENTS 6,377,324 B1    4/2002   Katsura
8,659,503 B2 *  2/2014   Kee ..................... G06F 1/1601
                                                  345/1.3
(Continued)

FOREIGN PATENT DOCUMENTS

CN    104978900 A    10/2015
CN    106205385 A    12/2016
(Continued)

OTHER PUBLICATIONS

International Search Report (Application No. PCT/IB2019/057030) dated Oct. 29, 2019.
(Continued)

*Primary Examiner* — Lisa Lea-Edmonds
(74) *Attorney, Agent, or Firm* — Husch Blackwell LLP

(57) ABSTRACT

Damage to a flexible display can be prevented. A display device having improved mechanical strength can be provided. A display device (10) includes a display panel (11) and a protection cover (12). The display panel (11) includes a first portion having flexibility. The protection cover (12) has a light-transmitting property and flexibility and is provided to overlap with a display surface side of the display panel (11). The display device (10) has a function of being reversibly changed in shape to a first mode in which the display panel (11) and the protection cover (12) are each substantially flat and a second mode in which the first portion of the display panel (11) is curved such that the display surface side becomes a concave surface and part of the protection cover (12) is curved in the same direction as the first portion. In the second mode, there is a gap between the first portion and the protection cover.

15 Claims, 18 Drawing Sheets

(51) Int. Cl.
*G06F 3/041* (2006.01)
*G09F 9/30* (2006.01)

(56) References Cited

U.S. PATENT DOCUMENTS

| | | | |
|---|---|---|---|
| 9,348,450 | B1 | 5/2016 | Kim |
| 9,557,771 | B2* | 1/2017 | Park .................. G06F 1/1681 |
| 9,817,261 | B2 | 11/2017 | Lee et al. |
| 9,857,844 | B2 | 1/2018 | Tsukamoto |
| 9,964,995 | B1* | 5/2018 | Morrison ............ H01Q 1/2266 |
| 10,013,020 | B2* | 7/2018 | Hong .................. G06F 1/1681 |
| 10,120,224 | B2 | 11/2018 | Lee et al. |
| 10,236,459 | B2 | 3/2019 | Hasegawa et al. |
| 10,241,600 | B2 | 3/2019 | Nade |
| 10,325,966 | B2 | 6/2019 | Isa |
| 10,461,275 | B2 | 10/2019 | Wang et al. |
| 11,615,721 | B2* | 3/2023 | Park .................. H10K 50/8445 313/511 |
| 2015/0192951 | A1 | 7/2015 | Chong et al. |
| 2015/0277131 | A1 | 10/2015 | Park et al. |
| 2016/0231837 | A1 | 8/2016 | Baek et al. |
| 2016/0334836 | A1* | 11/2016 | Hong .................. G06F 1/1681 |
| 2017/0142847 | A1 | 5/2017 | Park |
| 2017/0373281 | A1* | 12/2017 | Park .................. H10K 50/841 |
| 2018/0136786 | A1 | 5/2018 | Shigemori |
| 2018/0204884 | A1 | 7/2018 | Isa |
| 2019/0296089 | A1 | 9/2019 | Isa |

FOREIGN PATENT DOCUMENTS

| | | |
|---|---|---|
| CN | 106415432 A | 2/2017 |
| CN | 107210011 A | 9/2017 |
| CN | 107221256 A | 9/2017 |
| CN | 107851728 A | 3/2018 |
| EP | 2 927 740 A1 | 10/2015 |
| GB | 2 336 460 A | 10/1999 |
| JP | 2004-252676 A | 9/2004 |
| JP | 2011-085740 A | 4/2011 |
| JP | 2014-197522 A | 10/2014 |
| JP | 2014-219508 A | 11/2014 |
| JP | 2015-226204 A | 12/2015 |
| KR | 2015-0081931 A | 7/2015 |
| KR | 2016-0128564 A | 11/2016 |
| KR | 2018-0033510 A | 4/2018 |
| TW | 201243444 | 11/2012 |
| TW | 201514662 | 4/2015 |
| WO | WO 1999/034348 A1 | 7/1999 |
| WO | WO 2012/147188 A1 | 11/2012 |
| WO | WO 2015/011600 A1 | 1/2015 |
| WO | WO 2015/190733 A1 | 12/2015 |
| WO | WO 2017/013538 A1 | 1/2017 |
| WO | WO 2018/138779 A1 | 8/2018 |

OTHER PUBLICATIONS

Written Opinion (Application No. PCT/IB2019/057030) dated Oct. 29, 2019.

Chinese Office Action (Application No. 201980051995.5) dated Aug. 30, 2022.

Chinese Office Action (Application No. 201980051995.5) dated Mar. 29, 2023.

* cited by examiner

FIG. 2A
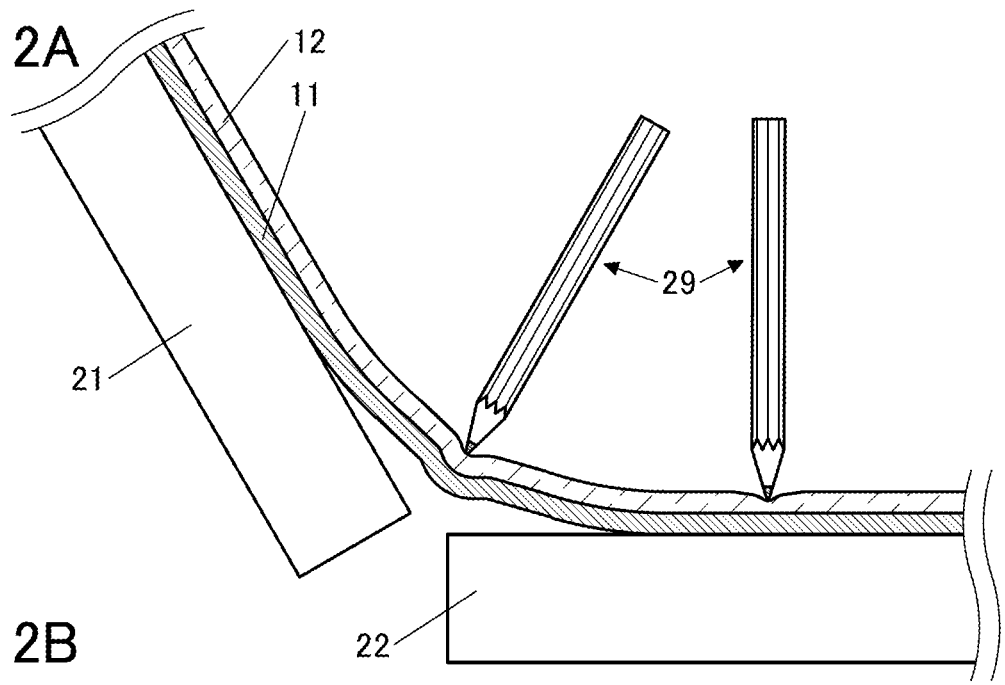
FIG. 2B
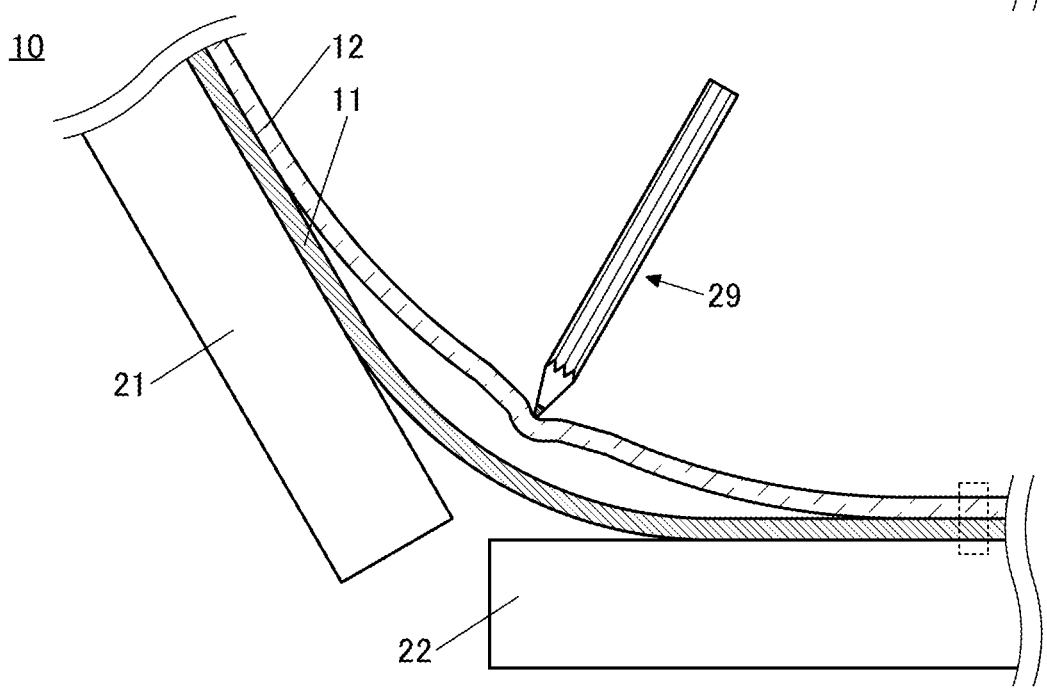
FIG. 2C  FIG. 2D  FIG. 2E  FIG. 2F
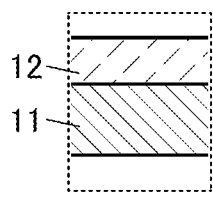 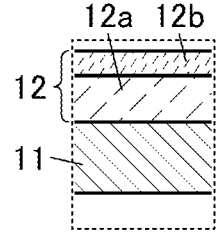 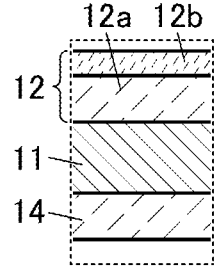 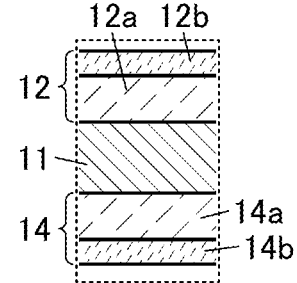

FIG. 4A 120°
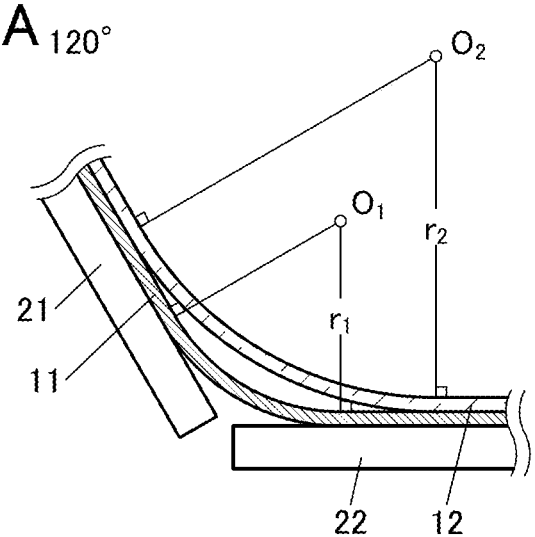
FIG. 4B 90°
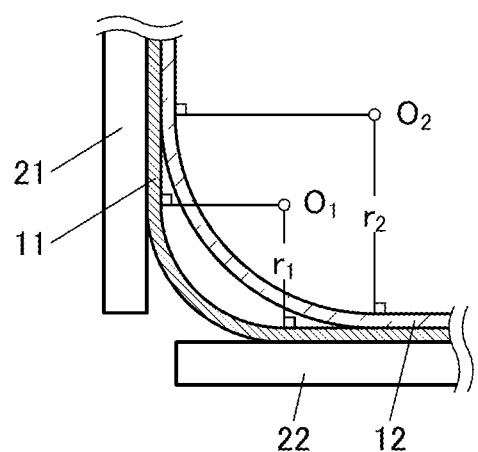
FIG. 4C 30°
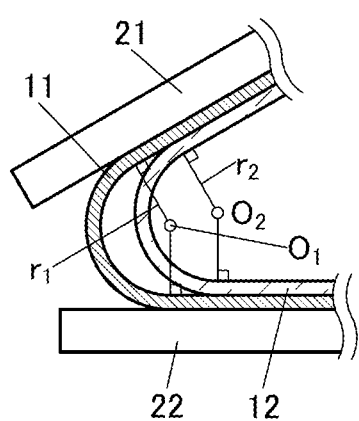
FIG. 4D 0°
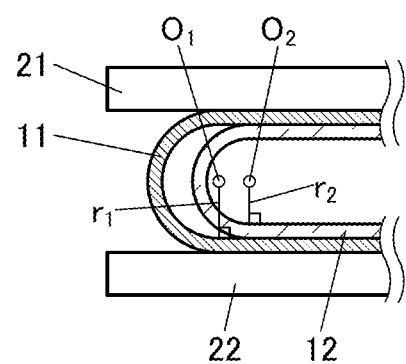

FIG. 10A
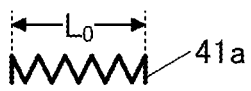
FIG. 10B1
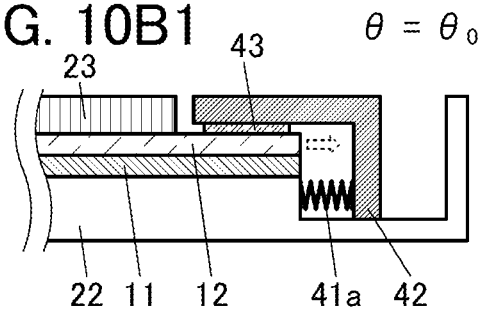
FIG. 10B2
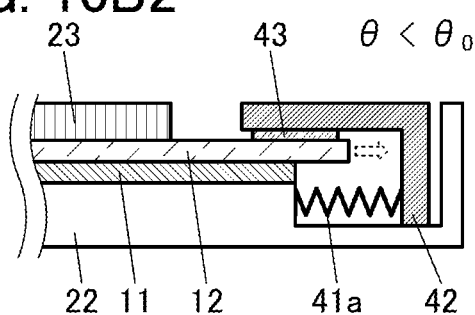
FIG. 10C1
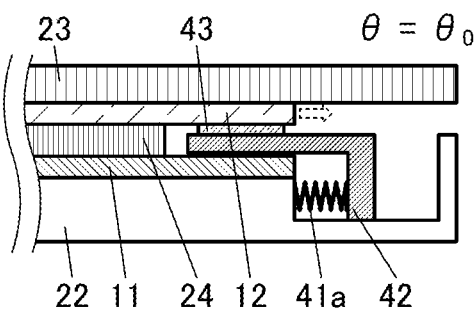
FIG. 10C2
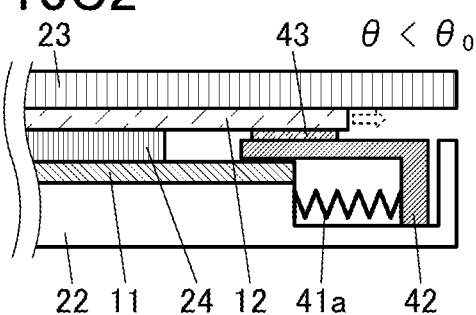
FIG. 10D
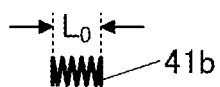
FIG. 10E1
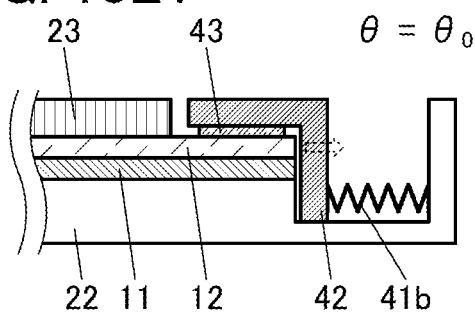
FIG. 10E2
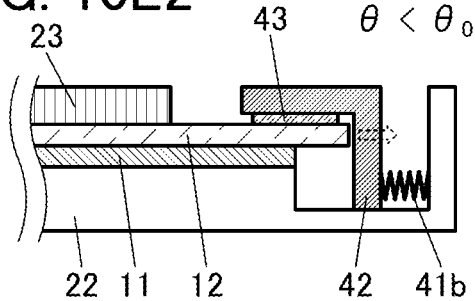
FIG. 10F1
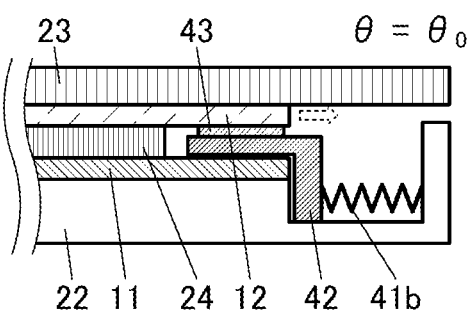
FIG. 10F2
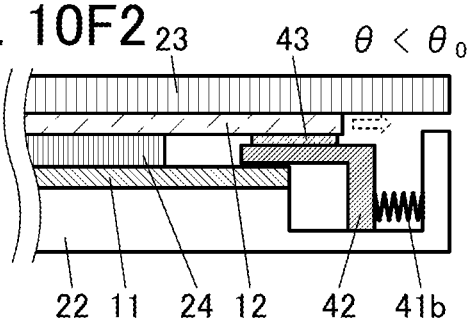

DISPLAY DEVICE

This application is a 371 of international application PCT/IB32019/057030 filed on Aug. 21, 2019 which is incorporated herein by reference.

TECHNICAL FIELD

One embodiment of the present invention relates to a display device and particularly relates to a display device including a flexible display.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a fabrication method thereof. A semiconductor device generally means a device that can function by utilizing semiconductor characteristics.

BACKGROUND ART

Flexible displays whose display surfaces can be curved have been actively developed. Light-emitting elements such as organic EL (electroluminescence) elements, liquid crystal element, and the like are typical display elements used in flexible displays.

The basic structure of an organic EL element is a structure in which a layer containing a light-emitting organic compound is provided between a pair of electrodes. By applying a voltage to this element, light emission can be obtained from the light-emitting organic compound. A display device using such an organic EL element does not need a light source such as a backlight; thus, a thin, lightweight, high-contrast, and low-power display device can be achieved.

For example, Patent Document 1 discloses a flexible light-emitting device using an organic EL element.

REFERENCE

Patent Document

[Patent Document 1] Japanese Published Patent Application No. 2014-197522

SUMMARY OF THE INVENTION

Problems to be Solved by the Invention

A problem of flexible displays, which are extremely thinner than conventional displays, is the difficulty in obtaining higher mechanical strength. For example, when a flexible display is made to function as a touch panel, in particular, a strong touch by a finger, a stylus, or the like on a display surface might damage the flexible display.

An object of one embodiment of the present invention is to prevent damage to a flexible display. Alternatively, an object is to provide a display device having improved mechanical strength. Alternatively, an object is to provide a display device having high reliability. Alternatively, an object is to provide a display device, or an electronic device having a novel structure.

Note that the descriptions of these objects do not preclude the existence of other objects. One embodiment of the present invention does not have to achieve all the objects. Note that objects other than them can be derived from the description of the specification, the drawings, the claims, and the like.

Means for Solving the Problems

One embodiment of the present invention is a display device including a display panel and a protection cover. The display panel includes a first portion having flexibility. The protection cover has a light-transmitting property and flexibility and is provided to overlap with a display surface side of the display panel. The display device has a function of being reversibly changed in shape to a first mode and a second mode. In the first mode, the display panel and the protection cover are each substantially flat. In the second mode, the first portion of the display panel is curved such that the display surface side becomes a concave surface, and part of the protection cover is curved in the same direction as the first portion. In the second mode, there is a gap between the first portion and the protection cover.

In the above, the display panel and the protection cover are preferably provided in contact with each other in the first mode. Alternatively, the display panel and the protection cover are preferably provided apart from each other in the first mode.

In the above, the protection cover preferably has a function of a touch panel or a circularly polarizing plate.

In the above, a functional layer having flexibility is preferably included between the display panel and the protection cover. At this time, part of the functional layer is preferably curved in the same direction as the first portion in the second mode. Furthermore, the functional layer preferably has a function of a touch panel or a circularly polarizing plate.

In the above, preferably, the display panel includes a second portion and a third portion, the first portion is positioned between the second portion and the third portion, the second portion and the third portion are substantially flat in the second mode, and, in the protection cover, a portion overlapping with the second portion and a portion overlapping with the third portion include a substantially flat region.

In the above, when an angle formed between a surface of the second portion and a surface of the third portion is an angle $\theta$, the display panel preferably includes, in a range of the angle $\theta$ greater than or equal to 90° and less than 180°, an angle range in which the protection cover is changed in shape so that a distance between an end portion of the second portion or an end portion of the third portion of the display panel and an end portion of the protection cover increases continuously when the angle $\theta$ is gradually reduced from 180°.

In the above, when an angle formed between a surface of the second portion and a surface of the third portion is an angle $\theta$, the display panel preferably includes, in a range of the angle $\theta$ greater than or equal to 90° and less than 180°, an angle range in which the curvature radius of the first portion is smaller than the curvature radius of a curved portion of the protection cover; and, in a range of the angle $\theta$ greater than or equal to 0° and less than 90°, an angle range in which the curvature radius of the first portion is larger than the curvature radius of the curved portion of the protection cover.

In the above, when an angle formed between a surface of the second portion and a surface of the third portion is an angle $\theta$, the display panel preferably includes, in a range of the angle $\theta$ greater than or equal to 90° and less than 180°, an angle range in which a distance between the first portion and the protection cover increases continuously when the angle θ is gradually reduced from 180°.

In the above, when an angle formed between a surface of the second portion and a surface of the third portion is an angle θ, preferably in the protection cover, tension is applied in a direction perpendicular to a pair of end portions intersecting with a curving direction, in a range of the angle θ greater than or equal to 90° and less than or equal to 180°.

In the above, a first support fixed to the second portion and a second support fixed to the third portion are preferably included. In this case, the first portion is preferably not fixed to either the first support or the second support.

In the above, preferably, one of the pair of end portions of the protection cover, which intersect with the curving direction, is fixed to the first support, and the other is not fixed to either the first support or the second support.

In the above, preferably, the first support has a first rotation axis perpendicular to the curving direction of the second portion and the second support has a second rotation axis parallel to the first rotation axis. In this case, preferably, the first support and the second support are capable of rotating in opposite directions at the same angle upon the first rotation axis and the second rotation axis, respectively, and relative positions of the first rotation axis and the second rotation axis does are constant.

In the above, preferably, the first support and the second support each include a retention member, and the protection cover is slidably attached to the retention member.

In the above, the protection cover preferably includes one or more of a urethane resin, an acrylic resin, and a silicone resin.

Effect of the Invention

According to one embodiment of the present invention, damage to a flexible display can be prevented. Alternatively, a display device having improved mechanical strength can be provided. Alternatively, a display device having high reliability can be provided. Alternatively, a display device, an electronic device, or the like having a novel structure can be provided.

Note that the descriptions of the effects do not preclude the existence of other effects. Note that one embodiment of the present invention does not need to have all these effects. Note that effects other than them can be derived from the description of the specification, the drawings, the claims, and the like.

BRIEF DESCRIPTION OF THE DRAWINGS

FIG. 2A to FIG. 2F are views illustrating structure examples of a display device.

FIG. 4A to FIG. 4D are views illustrating a structure example of a display device.

FIG. 10A to FIG. 10F2 are views illustrating structure examples of a display device.

MODE FOR CARRYING OUT THE INVENTION

Figure 1A:
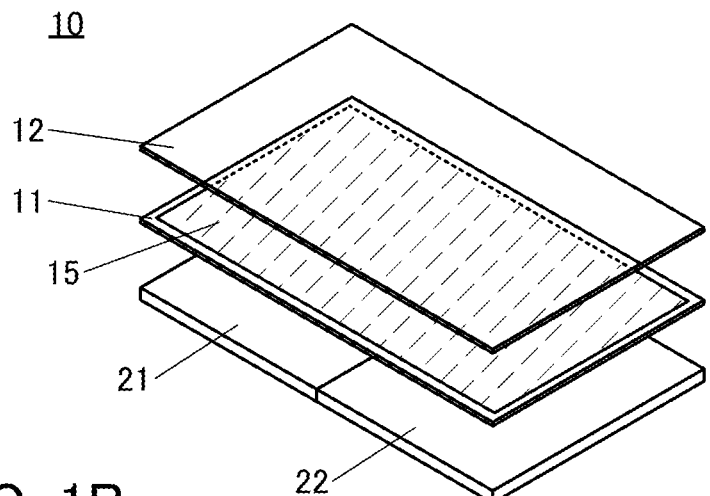
FIG. 1A to FIG. 1E are views illustrating a structure example of a display device.

Hereinafter, embodiments will be described with reference to the drawings. Note that the embodiments can be implemented in many different modes, and it will be readily appreciated by those skilled in the art that modes and details of the embodiments can be changed in various ways without departing from the spirit and scope thereof. Thus, the present invention should not be interpreted as being limited to the following description of the embodiments.

Note that in structures of the present invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

In each drawing described in this specification, the size, the layer thickness, or the region of each component is exaggerated for clarity in some cases. Therefore, they are not limited to the illustrated scale.

Note that in this specification and the like, the ordinal numbers such as "first" and "second" are used in order to avoid confusion among components and do not limit the number.

In this specification and the like, a display panel that is one embodiment of a display device has a function of displaying (outputting) an image or the like on (to) a display surface. Thus, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Note that in this specification and the like, a touch panel that is one embodiment of a display device has a function of displaying an image or the like on a display surface and a function of a touch sensor capable of sensing the contact, press, approach, or the like of a sensing target such as a finger or a stylus with or to the display surface. Thus, the touch panel is one embodiment of an input/output device.

A touch panel can be referred to as, for example, a display panel (or a display device) with a touch sensor, or a display panel (or a display device) having a touch sensor function. A touch panel can include a display panel and a touch sensor panel. Alternatively, a touch panel can have a function of a touch sensor in the display panel or on the surface of the display panel.

In this specification and the like, a substrate of a touch panel on which a connector and an IC are mounted is referred to as a touch panel module, a display module, or simply a touch panel or the like in some cases.

Embodiment 1

In this embodiment, a structure example of a display device of one embodiment of the present invention is described. A display device including a flexible display panel is described below.

Structure Example

FIG. 1A shows a schematic perspective view of a display device 10. The display device 10 includes a display panel 11, a protection cover 12, a support 21, and a support 22. The display panel 11 also includes a display portion 15.

At least part of the display panel 11 has flexibility and can be curved. A plurality of pixels are arranged in a matrix in the display portion 15 of the display panel 11, whereby an image can be displayed on the display portion 15.

At least one or more display elements are provided in the pixels provided in the display portion 15 of the display panel 11. As organic EL element can typically be used as the display element. Other than that, a variety of display elements such as light-emitting elements such as an inorganic EL element and an LED element, a liquid crystal element, a microcapsule, an electrophoretic element, an electrowetting element, an electrofluidic element, an electrochromic element, and a MEMS element can be used.

The protection cover 12 is positioned on a display surface side of the display panel 11 and has a function of protecting a surface of the display panel 11. The protection cover 12 has a light-transmitting property, thereby allowing an image displayed on the display portion 15 to be seen by a user through the protection cover 12. Moreover, at least part of the protection cover 12 has flexibility and can be curved.

The protection cover 12 may also function as a touch sensor panel or function as an optical film. When the protection cover 12 functions as a touch sensor panel, the protection cover 12 can include a sensor element such as a capacitive touch sensor, an optical sensor, or a pressure-sensitive touch sensor. As an optical film, a circularly polarizing plate, an anti-reflection film (including an AR (Anti-Reflection) film and an AG (Anti-Glare) film), and the like can be given, for example.

For the protection cover 12, a sheet-like member including at least one or more of a urethane resin, an acrylic resin, a silicone resin, a fluorine resin, an olefin resin, a vinyl resin, a styrene resin, an amide resin, an ester resin, and an epoxy resin is preferably used. In particular, a urethane resin has a relatively high dielectric constant and can increase the sensitivity when a capacitive touch sensor is used. In addition, a urethane resin is preferred because it can give excellent slidability and a self-healing function to a surface of the protection cover 12.

Preferably, an organic resin having a self-healing function is used particularly as the material that is positioned in the outermost surface of the protection cover 12, in which case surface scattering caused by a scratch or the like can be prevented and display quality can be maintained. When a water-repellent or oil-repellent resin is used as the organic resin or surface treatment is performed to make the organic resin water repellent or oil repellent, the surface of the protection cover 12 can be prevented from being contaminated with fingerprint marks or the like. As a material having a self-healing function, in addition to a urethane resin described above, materials including polyrotaxane, cyclodextrin, polyphenylene ether, or the like can be used. More preferably, in this case, the protection cover 12 has a structure in which the organic resin having a self-healing function is stacked over a sheet made of one or more of a urethane resin, an acrylic resin, and a silicone resin described above.

The slidability of the outermost surface of the protection cover 12 is preferably improved by coating, surface treatment, putting a film having excellent slidability, or the like. Furthermore, the slidability not only of the display surface side of the protection cover 12 but also of the surface on the display panel 11 side is preferably improved, in which case the display panel 11 and the protection cover 12 are easy to slide when provided in contact with each other.

The support 21 and the support 22 have a function of supporting the display panel 11. At least the surfaces of the support 21 and the support 22 which support the display panel 11 are preferably flat surfaces or smoothly curved surfaces. Preferably, these surfaces have rigidity to the extent that they are not changed in shape when pressed with a finger, a stylus, or the like by a person. For the surfaces of the support 21 and the support 22 which support the display panel 11, a material having relatively high rigidity, such as plastic, glass, metal, alloy, ceramics, or wood, for example, is preferably used.

The display panel 11 includes a portion fixed to the support 21, a portion fixed to the support 22, and, between these two portions, a portion not fixed to either support. Preferably, at least the portion of the display panel 11 which is not fixed to either the support 21 or the support 22 has flexibility.

Figure 1B:
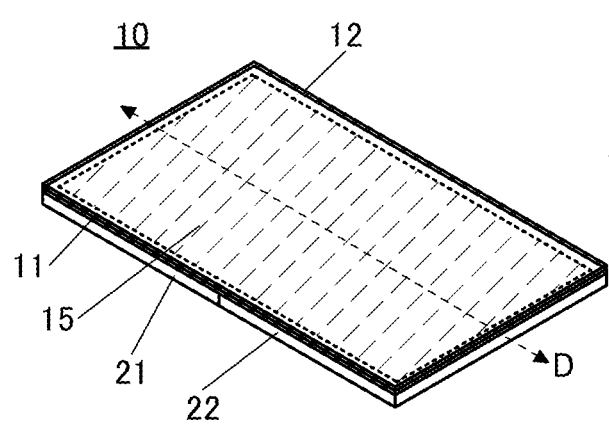

FIG. 1B shows a schematic perspective view of the display device 10 in a state where the display panel 11 and the protection cover 12 are not curved.

This is the state where the display panel 11 is supported by any of the support 21 and the support 22. In addition, the protection cover 12 is provided on the display surface side of the display panel 11. In this state, since the whole display panel 11 is supported by the support 21 and the support 22 having rigidity, mechanical strength against pressure from the display surface side is high. Here, the support 21 and the support 22 are preferably in close contact with each other so that, at least in a portion (also referred to as a seam) between their surfaces supporting the display panel 11, formation of a gap or a step is inhibited as much as possible.

Figure 1C:
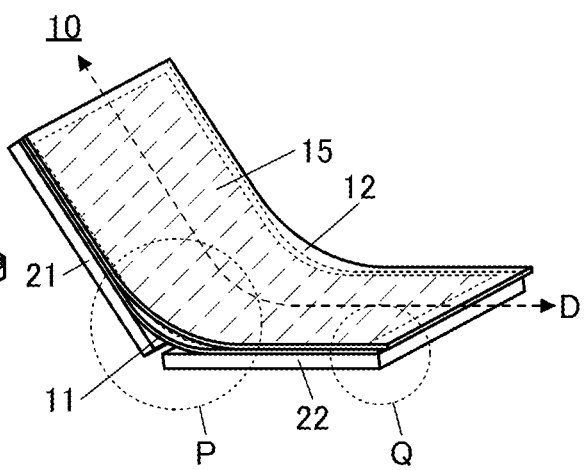
Figure 1D:
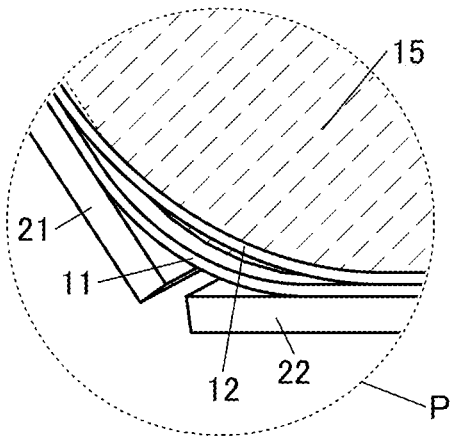
Figure 1E:
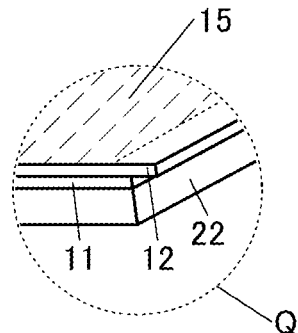

FIG. 1C shows a schematic perspective view of the display device 10 in a state where the display panel 11 and the protection cover 12 are curved. The display panel 11 is curved in such a manner that part of the display surface side becomes a concave surface. The protection cover 12 is also curved in the same direction in such a manner that part of the display surface side becomes a concave surface. FIG. 1D and FIG. 1E show enlarged views of regions P and Q, respectively, in FIG. 1C.

Here, the direction D of an arrow indicated by the dashed line in FIG. 1B and FIG. 1C corresponds to the curving direction of the display panel 11. In this case, the display panel 11 is curved so that the long-side direction and the curving direction of the display panel 11 are aligned. Note that the curving direction is not limited to this and may be aligned with the short-side direction. The curving direction may be a direction non-parallel to the sides of the outline of the display panel 11.

The region P is a region including end portions of the display panel 11 and the protection cover 12 in the curved portion. The region Q is a region including end portions of the display panel 11 and the protection cover 12 in a portion where they are not curved.

As illustrated in FIG. 1C and FIG. 1D, the display panel 11 and the protection cover 12 are apart from each other in the portion where the display panel 11 and the protection cover 12 are curved. In other words, there is a gap between the curved portion of the display panel 11 and the protection cover 12.

By curving the display panel 11 and the protection cover 12, the protection cover 12 is changed in shape as illustrated in FIG. 1C and FIG. 1E, so that an end portion (also referred to as a side) of the protection cover 12, which intersects with the curving direction, is shifted relatively outward compared to the end portion of the display panel 11 or an end portion of the support 22.

In order that the movement of the above shift be easily understood in FIG. 1A to FIG. 1E, the display device is illustrated such that the end portions of the display panel 11, the protection cover 12, the support 21, and the support 22 are aligned with one another when seen from above in the state where the display panel 11 and the protection cover 12 are not curved (i.e., the state of FIG. 1B).

When the display panel 11 is curved, the protection cover 12 is changed in shape so as to be shifted relative to the display panel 11. Thus, without expansion and contraction of both the display panel 11 and the protection cover 12, a gap can be provided between the display panel 11 and the protection cover 12 in the curved portion.

The effect of providing, in the curved portion of the display panel 11, the gap between the curved portion and the protection cover 12 is described using FIG. 2A and FIG. 2B. FIG. 2A is a cross-sectional view along the curving direction in which the display panel 11 is in close contact with the protection cover 12. FIG. 2B is a cross-sectional view in which there is a crescentic gap between these.

The curved portion of the display panel 11 is changed in shape as it is lifted up from the support 21 and the support 22, and consequently the curved portion is not supported by either the support 21 or the support 22.

As illustrated in FIG. 2A, at the portion where the display panel 11 is not curved and supported by the support 22, the protection cover 12 can be changed in shape to absorb even the pressure added by a tap of a protruding member (a stylus 29 here) from the protection cover 12 side; thus, the display panel 11 can be prevented from being changed in shape and being damaged. By contrast, in the curved portion of the display panel 11, since the rear side of the display panel 11 is not supported, the display panel 11 is also changed in shape by following the change in the shape of the protection cover 12. This might damage the display panel 11 to allow the stylus 29 to penetrate therethrough in the worst case.

However, in one embodiment of the present invention, since there is a gap between the protection cover 12 and the display panel 11 in the curved portion of the display panel 11, even the pressure added by a tap of the stylus 29 is absorbed by a change in the shape of the protection cover 12 to never reach the display panel 11, as illustrated in FIG. 2B. Thus, a display device having excellent mechanical strength can be achieved.

The case where the curved portion of the display panel 11 is not supported by the support 21 and the support 22 is described so far. However, for example, in the case where the support 21 and the support 22 are replaced by a support that can also support the curved portion of the display panel 11, at least the surface supporting the display panel 11 needs to be changed in shape or expanded or contracted. Thus, the surface of the support that supports the display panel 11 needs to have flexibility or elasticity, which renders high rigidity difficult to provide. Consequently, when the display surface side of the display panel 11 is tapped, the surface of the support might be changed in shape by the pressure to make the display panel 11 itself have a concave shape, leading to damage. Therefore even in such a case, the structure where a gap between the display panel 11 and the protection cover 12 is provided to prevent a contact therebetween so that pressure can be absorbed by a change in the shape of the protection cover 12 is extremely effective.

Here, a stacked-layer structure of the display panel 11 and the protection cover 12 is described. FIG. 2C to FIG. 2F are enlarged views of a cross section in the region surrounded by the dashed line in FIG. 2B.

FIG. 2C is an example in which the display panel 11 is provided in contact with the protection cover 12.

In an example shown in FIG. 2D, the protection cover 12 has a stacked-layer structure in which a functional layer 12a and a functional layer 12b are stacked. The functional layer 12b positioned on the display surface side (the side opposite the display panel 11) is a layer including the above-described organic resin having a self-healing function. As the functional layer 12a positioned on the display panel 11 side, the above-described sheet-like member including a urethane resin or the like can be used.

As illustrated in FIG. 2E, a protection cover 14 may be provided on the rear surface side (support 21 or support 22 side) of the display panel 11. Since the curved portion of the display panel 11 is not supported by the support 21 and the support 22, providing the protection cover 14 on the rear surface side of the display panel 11 can improve the mechanical strength of the display device 10. For the protection cover 14, a material similar to that of the protection cover 12 is used.

Here, the protection cover 14 may have a stacked-layer structure in which a functional layer 14a and a functional layer 14b are stacked as illustrated in FIG. 2F. Materials similar to those of the above functional layer 12a and functional layer 12b can be used for the functional layer 14a and the functional layer 14b, respectively.

Next, a preferred shape when the display panel 11 and the protection cover 12 are curved or the like is described in detail.

FIG. 3A to FIG. 3F are schematic cross-sectional views along a curving direction of the display device 10. In each drawing, a rotation axis 31a of the support 21 and a rotation axis 32a of the support 22 are each indicated by a circle.

The angle shown in each drawing indicates an angle formed between a pair of flat surfaces between which the curved portion of the display panel 11 is interposed. Note that this angle can be rephrased as an angle formed between a pair of surfaces of the support 21 and the support 22 which support the display panel 11 or as an angle obtained by subtracting the sum of the absolute values of the rotation angles of the support 21 and the support 22 (angles of rotations from the state of FIG. 3A) from 180°. In the following description, the angle formed between the pair of flat surfaces between which the curved portion of the display panel 11 is interposed may be simply referred to as an "angle".

Figure 3A:
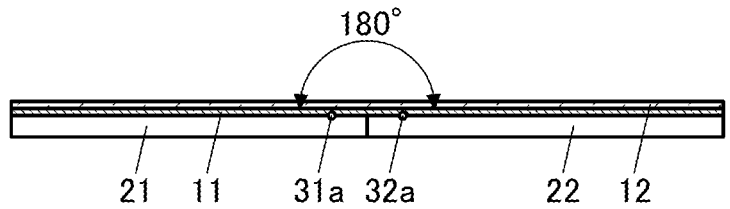
FIG. 3A to FIG. 3F are views illustrating a structure example of a display device.
Figure 3B:
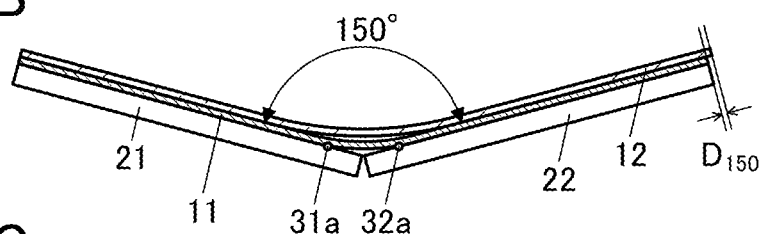
Figure 3C:
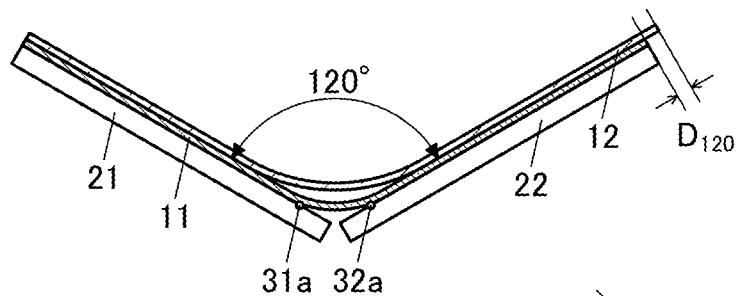
Figure 3D:
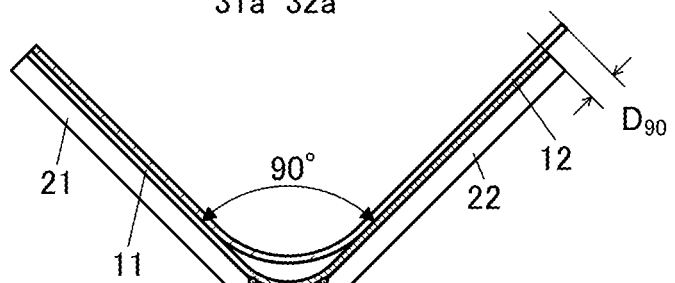
Figure 3E:
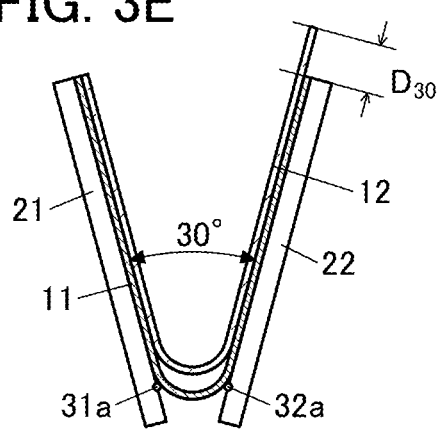
Figure 3F:
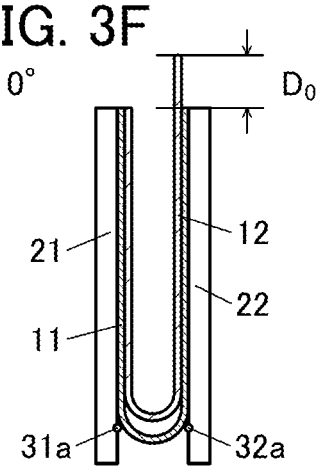
Figure 5A:
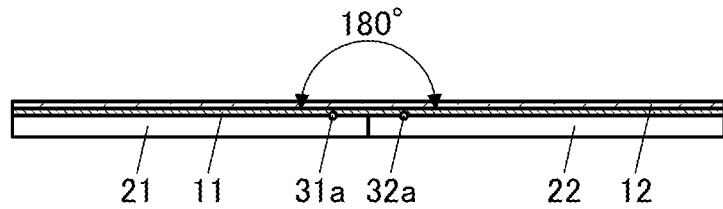
FIG. 5A to FIG. 5F are views illustrating a structure example of a display device.
Figure 5B:
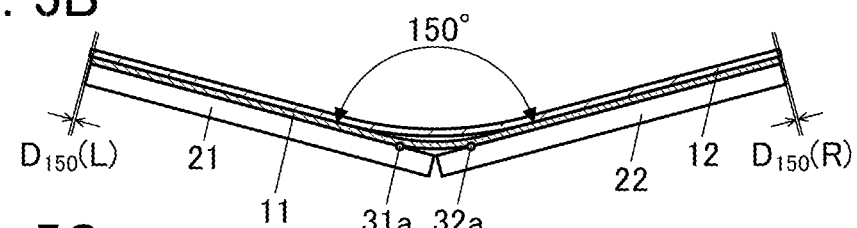
Figure 5C:
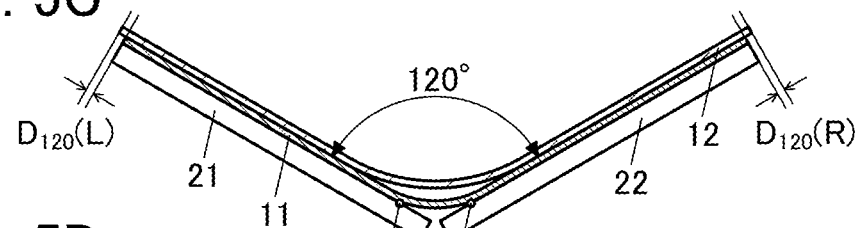
Figure 5D:
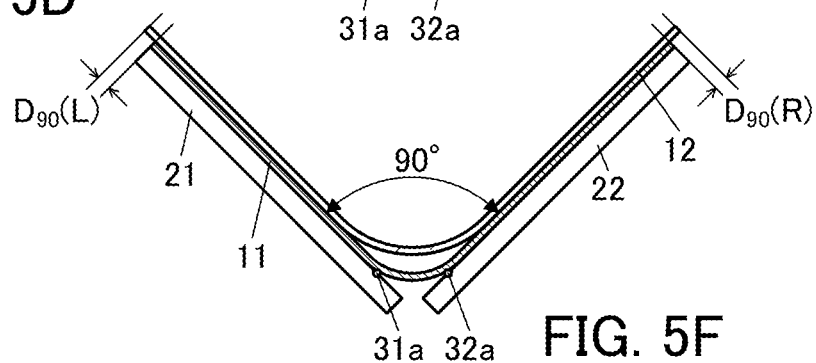
Figure 5E:
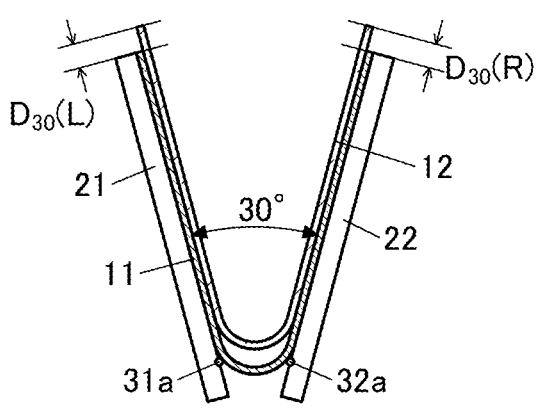
Figure 5F:
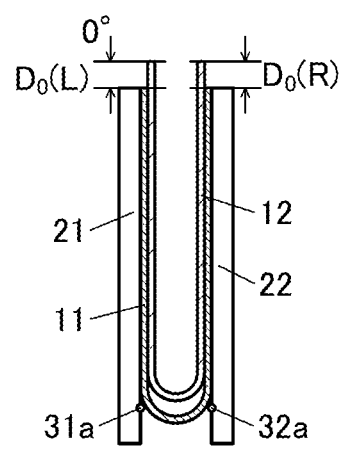

Note that here, the case where the display panel 11 and the protection cover 12 have an equal length in the cross sectional direction is shown for simplification. The case where the end portions of the display panel 11 and the protection cover 12 are aligned with each other when the display panel 11 is not curved, as illustrated in FIG. 3A, is shown.

FIG. 3A to FIG. 3F show examples in which the end portions of the protection cover 12 and the support 21 are fixed to each other. In other words, the protection cover 12 is changed in shape in such a manner that it slides (shifts) to the support 22 side.

FIG. 3B, FIG. 3C, FIG. 3D, FIG. 3E, and FIG. 3F show the cases where the angles are 150°, 120°, 90°, 30°, and 0°, respectively. Each drawing clearly shows the amount of shift of the protection cover 12 from the state where the angle is 180° (i.e., the state where the display panel 11 is not curved). Here, $D_\alpha$, denotes the shift amount when the angle is $\alpha°$ and, for example, $D_{150}$ denotes the shift amount when the angle is 150°.

Preferably, at least in a range of the angle greater than or equal to 90° and less than or equal to 180°, the shift amount of the protection cover 12 gradually increases as the angle decreases. Note that the shift amount is shown to gradually increase even when the angle is less than 90°; in this angle range, however, the shift amount may be unchanged or decrease.

Here, when the display panel 11 functions as a touch panel, it is preferably used in a range of the angle greater than or equal to 90° and less than 180° during operation of the display panel 11 in the curved state. Curving the display panel 11 with the angle less than that (i.e., less than) 90° hinders touch operation and input operation with a pen. For this reason, preferably, at least in a range of the angle greater than or equal to 90° and less than 180°, as the angle decreases, the protection cover 12 is changed in shape so that the gap between the display panel 11 and the protection cover 12 increases, i.e., the shift amount of the protection cover 12 increases.

Moreover, tension in the curving direction (i.e., force pulling to the outside) is preferably applied to the end portion of the protection cover 12 in the state where the display panel 11 is flat (i.e., with an angle of 180°) or in the state where the display panel 11 is curved with a predetermined angle at least in a range of the angle greater than or equal to 90° and less than 180°. Such a structure can prevent bending of the surface of the protection cover 12 to inhibit surface scattering of external light, whereby the display device can have high visibility. Furthermore, the protection cover 12 always has the same shape at the same angle by being kept pulled tight even after repeated changes in shape between the curved state and the flat state, whereby the display device can have high reliability.

A mechanism that applies the tension to the protection cover 12 may be a mechanism that pulls any one of the pair of end portions of the protection cover 12 perpendicular to the curving direction. Alternatively, a mechanism that pulls both of the end portions may be employed. Such a mechanism may be included in any one or both of the support 21 and the support 22 or may be incorporated in a housing of an electronic device or the like separately from the supports.

FIG. 4A to FIG. 4D show schematic cross-sectional views of the enlarged curved portion of the display panel 11. FIG. 4A, FIG. 4B, FIG. 4C, and FIG. 4D show the states where the angles are 120°, 90°, 30°, and 0°, respectively.

Here, the case where the display panel 11 and the protection cover 12 are each curved in an ideal arc shape is described. Although an ideal arc shape is not necessarily formed depending on the structure of the display device, a side surface or a cross section of each curved portion can be approximated by an ideal arc even in such a case.

FIG. 4A to FIG. 4D show a center $O_1$ and a curvature radius $r_1$ of an arc formed by the curved surface on the display surface side of the display panel 11 and a center $O_2$ and a curvature radius $r_2$ of an arc formed by the curved surface on the top surface side (the side opposite the display panel 11) of the protection cover 12.

At least in a range of the angle less than 180° and greater than or equal to 90°, the curvature radius $r_1$ of the display panel 11 and the curvature radius $r_2$ of the protection cover 12 preferably satisfy $r_1 < r_2$. In other words, at least in the above angle range, the protection cover 12 is preferably curved with a larger radius of curvature than that of the display panel 11. This allows a gap having a crescent shape cross section to be favorably formed between the display panel 11 and the protection cover 12 in the curved portion, as illustrated in FIG. 4A and FIG. 4B. In addition, the portion where the gap is not provided (e.g., the portion where the display panel 11 and the protection cover 12 are in contact with each other) can be a portion where the display panel 11 is always supported by the support 21 or the support 22.

At a predetermined angle less than 90°, the relationship between the curvature radius $r_1$ and the curvature radius $r_2$ is reversed to make the curvature radius $r_2$ smaller than the curvature radius $r_1$, as illustrated in FIG. 4C and FIG. 4D, for example.

When the center $O_1$ and the center $O_2$ are focused on, the center $O_1$ is preferably always positioned more on the inner side (the display panel 11 side) than the center $O_2$. This allows the gap to be formed between the display panel 11 and the protection cover 12 whenever the display panel 11 is curved.

Note that the center $O_1$ and the center $O_2$ become substantially the same when the display panel 11 and the protection cover 12 that are integrated by adhesion, for example, are curved.

If the display panel 11 and the protection cover 12 are integrated by adhesion, for example, the integrated display panel and protection cover is thick in total, and the stress caused by curving the display panel 11 is large accordingly, resulting in a fracture of the display panel 11 in the worst case. By contrast, in the display device 10 where the display panel 11 and the protection cover 12 are curved with different radii of curvature independently of each other, the stress caused by curving the display panel 11 can be reduced, whereby damage can be prevented.

Modification Examples

Modification examples of the above structure example are described below.

Modification Example 1

Although the end portions of the protection cover 12 and the support 21 are fixed to each other in the structures exemplified above with reference to FIG. 3A and the like, a structure in which the protection cover 12 is not fixed to any support is also possible.

FIG. 5A to FIG. 5F illustrate a structure in which the protection cover 12 can be shifted to both the support 21 side and the support 22 side.

Here, (L) denotes the amount of the shift of the protection cover 12 to the support 21 side and (R) denotes the amount of the shift to the support 22 side. For example, $D_{150}(L)$ and $D_{150}(R)$ denote the amount of the shift of the protection cover 12 to the support 21 side and the amount of the shift to the support 22 side, respectively at an angle of 150°. Here, in the case where the shape of the curved portion of the protection cover 12 is similar to the structure illustrated in FIG. 3B or the like, for example, the sum of $D_{150}(L)$ and $D_{150}(R)$ is substantially equal to $D_{150}$ of FIG. 3B.

In the above-described structure in which the pair of end portions of the protection cover 12 is thus shifted when the protection cover 12 is curved, the amount of the shift of the protection cover 12 toward the support 22 can be smaller than that in the structure illustrated in FIG. 3A or the like. Consequently, an electronic device including the display device can be reduced in size.

Note that the amount of the shift of the protection cover 12 to the support 21 side and the amount of the shift to the support 22 side may be equal or may be different from each other. The shift amounts are preferably substantially equal, in which case the amount of the shift of the protection cover 12 toward the support 21 and the amount of the shift toward the support 22 can be minimized.

Modification Example 2

In the portion where the display panel 11 is not curved, a gap may be provided between the display panel 11 and the protection cover 12, which are provided in contact with each other in the examples described in the above structure example and Modification Example 1.

FIG. 6A to FIG. 6F show an example in which a gap of a distance G is provided between the display panel 11 and the protection cover 12 so that these are not in contact with each other.

The portion of the display panel 11 that is not curved is also not in contact with the protection cover 12, as described above, whereby the mechanical strength can further be improved.

Figure 6A:
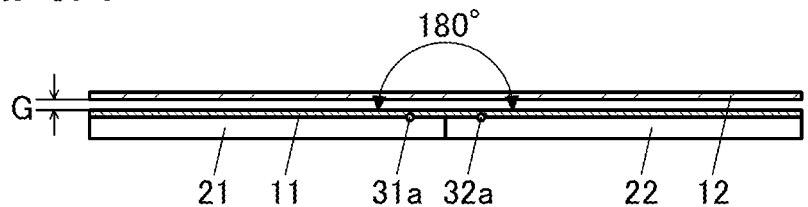
FIG. 6A to FIG. 6F are views illustrating a structure example of a display device.
Figure 6B:
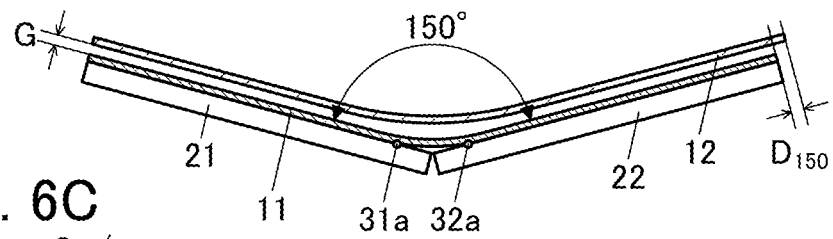
Figure 6C:
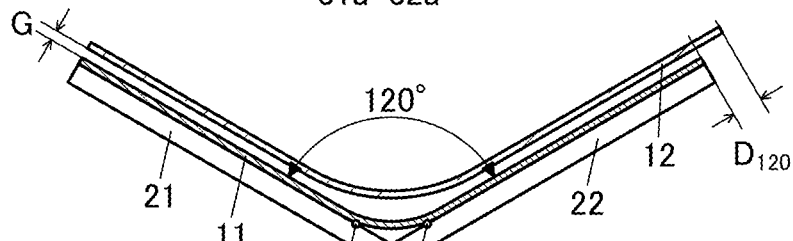
Figure 6D:
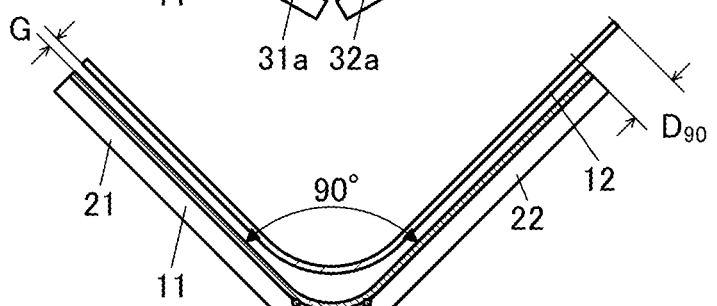
Figure 6E:
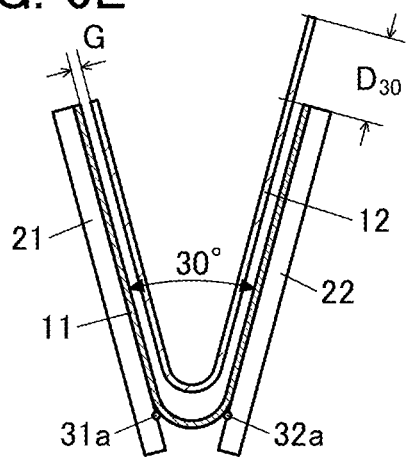
Figure 6F:
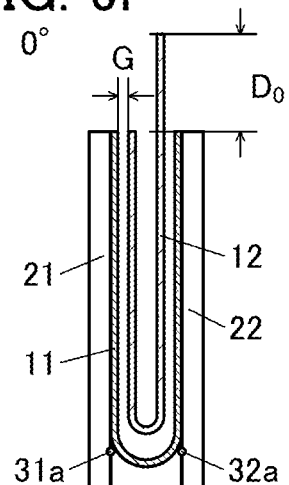

In the case where the display panel 11 and the protection cover 12 are not curved as illustrated in FIG. 6A, the protection cover 12 is preferably supported by the support 21, the support 22, a housing of an electronic device, or the like so that the distance (distance G) between the display panel 11 and the protection cover 12 is uniform at least in the display portion 15. If the distance between the display panel 11 and the protection cover 12 becomes non-uniform by, for example, bending of part of the protection cover 12, surface reflection of the protection cover 12 might be uneven, resulting in lower visibility. Thus, the distance between the display panel 11 and the protection cover 12 is made uniform, so that a display device with high display quality can be achieved.

The support 21, the support 22, and the like are provided with a mechanism such as a slit structure for retaining the protection cover 12 to be slidable, for example, outside the display portion 15.

A structure in which air exists (also referred to as a structure in which an air gap is provided) between the display panel 11 and the protection cover 12 can be employed. A fluent material such as a gas, a liquid, a gel, or a sheet-like member having fluidity may be provided between the display panel 11 and the protection cover 12. As the fluent material here, a material having a refractive index higher than that of air can be used. In particular, the refractive index is preferably close to that of the member positioned on the outermost surface of the display panel 11 or that of a member forming the protection cover 12, in which case the light extraction efficiency can be increased (e.g., the refractive index differs by 10% or lower, preferably 5% or lower).

Modification Example 3

One or more sheet-like members may be provided between the display panel 11 and the protection cover 12.

FIG. 7A to FIG. 7D show an example in which a functional layer 13 is provided between the display panel 11 and the protection cover 12. The functional layer 13 preferably has flexibility like the display panel 11, the protection cover 12, and the like.

The functional layer 13 may also function as a touch sensor panel or function as an optical film. As a touch sensor panel, the functional layer 13 can include a sensor element such as a capacitive touch sensor, an optical sensor, or a pressure-sensitive touch sensor. As an optical film, a circularly polarizing plate, an anti-reflection film (including an AR film and an AG film), and the like can be given, for example.

Figure 7A:
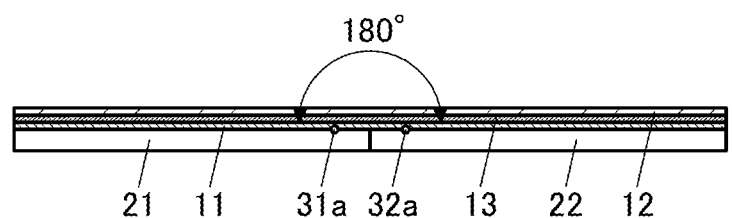
FIG. 7A to FIG. 7D are views illustrating a structure example of a display device.
Figure 7B:
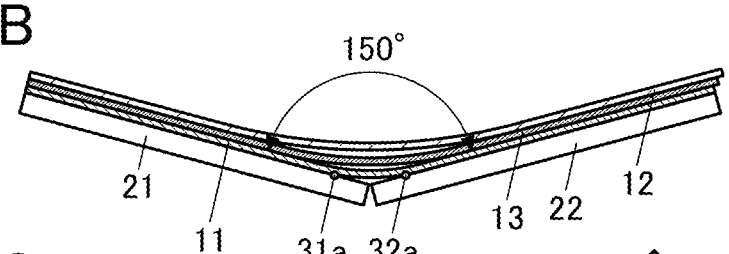
Figure 7C:
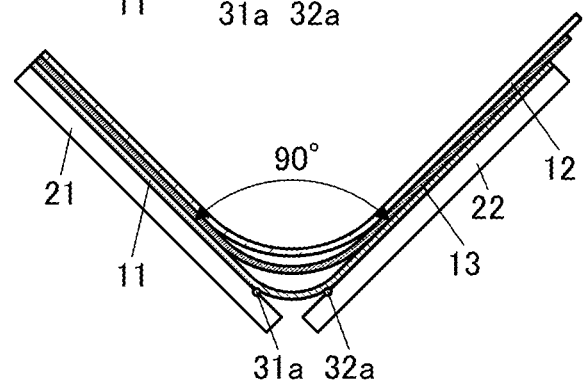
Figure 7D:
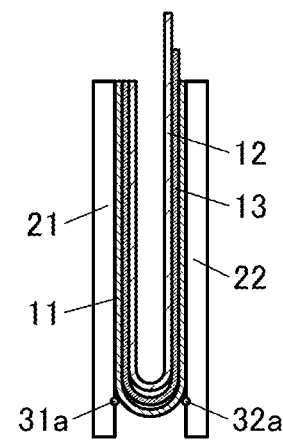

As illustrated in FIG. 7B to FIG. 7D, when the display panel 11 is curved, part of the functional layer 13 is preferably changed in shape to be shifted relative to the display panel 11 so that there is a gap between the curved portion of the display panel 11 and the functional layer 13. Here, the functional layer 13 and the protection cover 12 are each preferably changed in shape so that a gap is also provided therebetween.

When the display panel 11 is curved in a range greater than or equal to 90° and less than 180° as illustrated in FIG. 7B and FIG. 7C, the functional layer 13 is preferably curved with a curvature radius larger than that of the display panel 11 and smaller than that of the protection cover 12. When the display panel 11 is folded (when the angle is 0°) as illustrated in FIG. 7D, the functional layer 13 is preferably curved with a curvature radius smaller than that of the display panel 11 and larger than that of the protection cover 12.

Although FIG. 7A and the like show the example in which there are contacts between the display panel 11 and the functional layer 13 and between the functional layer 13 and the protection cover 12 when the display panel 11 is not curved, the structure in which they are not in contact with each other as described above in Modification Example 2 may be employed.

Although the example in which the functional layer 13 and the protection cover 12 are shifted only to the support 22 side is shown in FIG. 7A and the like, the structure in which they are shifted both to the support 21 side and the support 22 side as described above in Modification Example 1 may be employed.

When the functional layer 13 is sufficiently thinner than the display panel 11 or sufficiently more flexible than the display panel 11, the functional layer 13 may be fixed to the display panel 11 or the protection cover 12. Particularly when the display panel 11 adheres to the functional layer 13, the neutral plane of a stacked body where the display panel 11 and the functional layer 13 are stacked is preferably positioned inside the display panel 11.

Structure Example of Support

Next, a structure example of the support 21 and the support 22 is described.

Figure 8A:
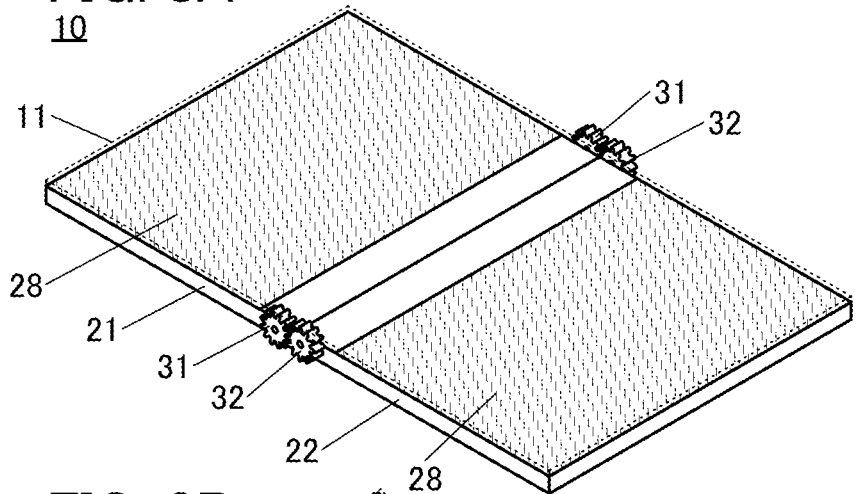
FIG. 8A to FIG. 8C are views illustrating a structure example of a display device.
Figure 8B:
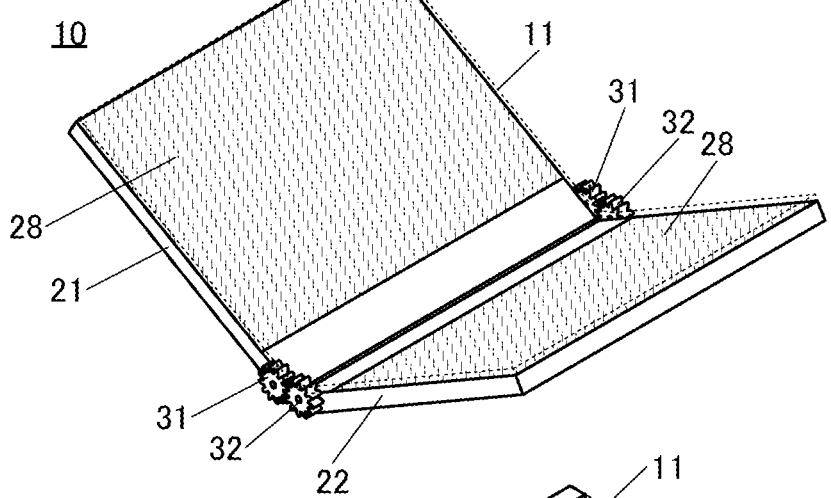
Figure 8C:
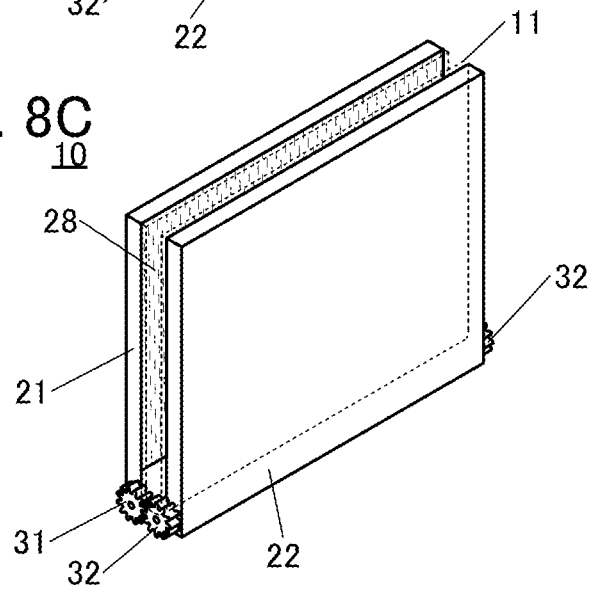

FIG. 8A to FIG. 8C each show a schematic perspective view of the support 21 and the support 22. In each drawing, the display panel 11 is indicated by a dashed line. FIG. 8A is a state in which the display panel 11 is not curved, FIG. 8B is a curved state in which the angle formed between two flat surfaces of the display panel 11 is 120°, and FIG. 8C is a curved state in which the two flat surfaces of the display panel 11 are made parallel to each other (i.e., so that the angle formed therebetween is 0°).

A pair of gears 31 is attached to each end of the support 21, and a pair of gears 32 is attached to each end of the support 22. The gears 31 and the gears 32 are fixed to the support 21 and the support 22, respectively. The gear 31 and the gear 32 mesh with each other with a gear ratio of 1:1 and can rotate in opposite directions at the same angle. Therefore, the support 21 and the support 22 can rotate in opposite directions at the same angle. This allows the support 21 and the support 22 to be reversibly changed in shape from the mode illustrated in FIG. 8A to the mode illustrated in FIG. 8C through the mode illustrated in FIG. 8B.

With such a structure, the support 21 and the support 22 can rotate on their respective rotation axes while the relative positions of their rotation axes are not changed. With such a structure, even when the display panel 11 is fixed to both the support 21 and the support 22, the display panel 11 can be curved without being expanded and contracted in the curving direction.

FIG. 8A to FIG. 8C also illustrate a region 28, where the display panel 11 is always supported by the support 21 or the support 22. In other words, the region 28 is where the display panel 11 is always fixed along the surface of the support 21 or the support 22. In a region between a pair of regions 28, the display panel 11 can be lifted up from the surface of the support 21 or the support 22 without being fixed to the support 21 and the support 22.

For example, in the region 28, the display panel 11 can be fixed to the support 21 and the support 22 by adhesion with an adhesive material, an adhesive sheet, or the like. Alternatively, all the regions including the portion where the display panel 11 is to be curved may be bonded to the support 21 and the support 22 with a low-viscosity adhesion sheet which is easy to peel off. In this case, the portion where the display panel 11 is not curved is in a state substantially fixed to the support 21 or the support 22 because the portion does not lift (peel off) from the support 21 or the support 22 even when the support 21 and the support 22 are rotated.

Figure 9A:
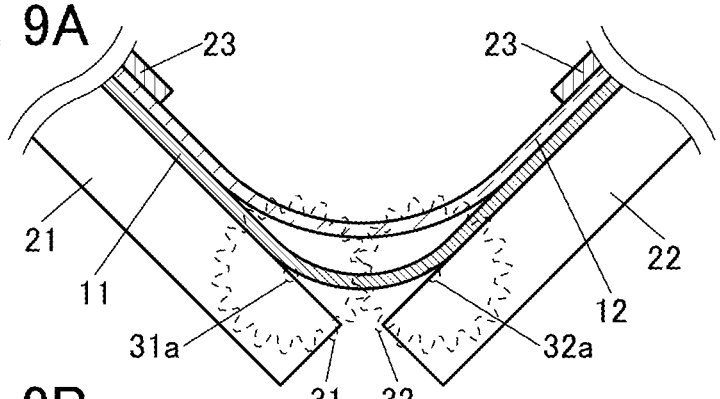
FIG. 9A to FIG. 9D are views illustrating structure examples of a display device.

FIG. 9A is a schematic side view of the curved portion where the display panel 11 is curved at 90°, which is seen from the direction perpendicular to the curving direction. In FIG. 9A, the gear 31 and the gear 32 are indicated by dashed lines.

FIG. 9A shows an example in which the support 21 and the support 22 are each provided with a retention member 23. The display panel 11 and the protection cover 12 include a region interposed between the support 21 and the retention member 23 and a region interposed between the support 22 and the retention member 23. The retention member 23 has a function of a guide retaining the display panel 11 or the protection cover 12 to be slidable.

The pair of retention members 23 can be provided in a region on the outer side of the display portion of the display panel 11. For the pair of retention members 23, a member having a top surface shape of a U-shape surrounding the display portion of the display panel 11 or a square bracket shape (square bracket like shape) can be used. The retention member 23 may be fixed to the support 21 or the support 22 with a screw, an adhesive material, or the like or they may be integrally formed. The retention member 23 is fixed to the support 21 or the support 22 and thus can be construed as being part of the support 21 or the support 22.

The protection cover 12 is retained to be slidable between the display panel 11 and the retention member 23.

Figure 9B:
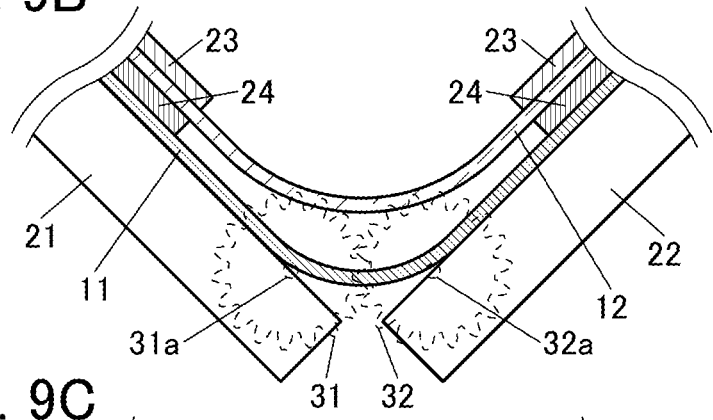

FIG. 9B shows an example in which a spacer 24 is provided between the display panel 11 and the protection cover 12. With the spacer 24, the display panel 11 and the protection cover 12 are retained apart from each other by the thickness of the spacer 24.

The protection cover 12 is retained to be slidable between the spacer 24 and the retention member 23. Thus, it can also be said that the retention member 23 and the spacer 24 form a slit structure for retaining the protection cover 12.

The spacer 24 may have a U-shape top surface like the retention member 23. Alternatively, the spacer 24 may be provided along both ends of the retention member 23. The spacer 24 is preferably fixed to the support 21 or the support 22. The spacer 24 can be construed as being part of the support 21 or the support 22.

Figure 9C:
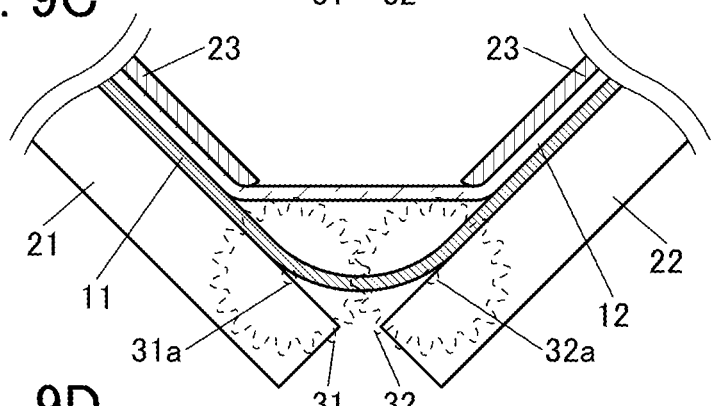
Figure 9D:
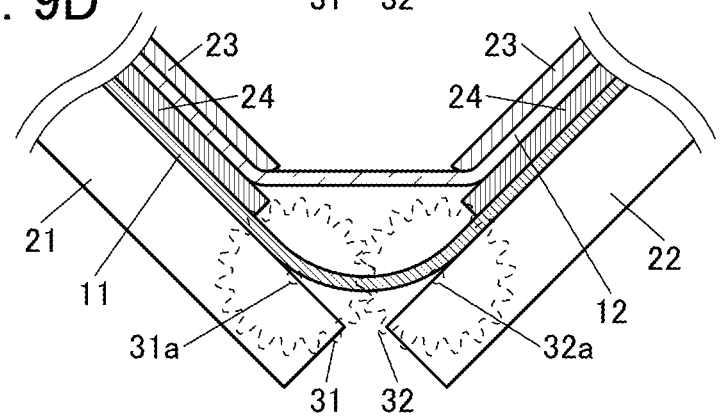

FIG. 9C and FIG. 9D show examples in which the shape of an end portion of the retention member 23 is different from the above.

In FIG. 9C and FIG. 9D, the end portion of the retention member 23 is processed into a convex surface. For example, the end portion of the retention member 23 is preferably processed into a cross-sectional shape over an arc.

In the end portions of the pair of retention members 23, the protection cover 12 is changed in shape to be curved along the curved surface. Since the end portions of the retention member 23 are processed into a convex surface, the protection cover 12 can be prevented from being curved with a smaller radius than the radius of curvature of the curved surface. That is, the retention member 23 has a function of adjusting the curvature of the protection cover 12.

In the case where such a retention member 23 is provided, the curved portion of the protection cover 12 can be formed of a pair of curved portions with a smaller radius of curvature than that of the display panel 11 and a substantially flat portion between the pair of curved portions. Even with such a structure, the distance between the curved portion of the display panel 11 and the protection cover 12 can be changed depending on the angle at which the display panel 11 is curved.

Next, an example of a tensile mechanism for applying tension to the end portion of the protection cover 12 is described. Tension is applied along the curving direction of the protection cover 12 from the end portion side, whereby generation of a crease or a sag in the protection cover 12 can be inhibited. This can prevent misalignment of the protection cover 12 and the display panel 11 even when bending and expanding operations are repeated.

FIG. 10B1 shows a schematic cross-sectional view of the vicinity of the end portion of the support 22. The display panel 11 and the protection cover 12 are provided between the support 22 and the retention member 23. The protection cover 12 is retained to be slidable along the display panel 11.

Furthermore, a spring 41a and a movable member 42 are provided in the vicinity of the end portion of the support 22. In the support 22, a concave portion where the movable member 42 can move is provided such that the shape of the concave portion adjusts the movable range of the movable member 42.

The movable member 42 is fixed to the protection cover 12 by an adhesive member 43. Although FIG. 10B1 shows an example in which the movable member 42 is fixed to the top surface of the protection cover 12, the present invention is not limited thereto and the movable member 42 may be fixed to the rear surface of the protection cover. The method of fixing the movable member 42 and the protection cover 12 is not limited to these; for example, the protection cover 12 may be fitted into the movable member 42 so that they are fixed without the adhesive member 43.

FIG. 10A illustrates the spring 41a whose length is an equilibrium length $L_0$. As illustrated in FIG. 10B1, the spring 41a in a state of being compressed from the equilibrium length $L_0$ is placed between the support 22 and the movable member 42. Thus, as indicated by the dashed arrow in FIG. 10B1, outward tension is always applied to the protection cover 12 through the movable member 42.

FIG. 10B1 shows a state where the display panel 11 is curved at an angle $\theta_0$ ($\theta=\theta_0$), and FIG. 10B2 shows a state where the display panel 11 is curved at the smaller angle ($\theta<\theta_0$). Here, $\theta_0$ is 180°, i.e., includes the state where the display panel 11 is not curved.

FIG. 10C1 and FIG. 10C2 show an example of the case where the spacer 24 is provided. In the example shown in FIG. 10C1 and FIG. 10C2, the rear surface of the protection cover 12 and the movable member 42 are fixed to each other with the adhesive member 43. As illustrated in FIG. 10C1 and FIG. 10C2, the retention member 23 may be provided to cover the end portion of the protection cover 12, the spring 41a, the adhesive member 43, and the movable member 42.

Although the example where the spring 41a is used in the contracted state is described above, the spring may be used in the expanded state.

FIG. 10D illustrates a spring 41b whose length is the equilibrium length $L_0$. As illustrated in FIG. 10E1 and FIG. 10E2, the ends of the spring 41b, which is in a state of being expanded from the equilibrium length $L_0$, are fixed to the movable member 42 and the support 22.

FIG. 10F1 and FIG. 10F2 show an example of the case where the spacer 24 is provided.

The movable range of the movable member 42, the spring coefficient of the spring, and the like of the tensile mechanism exemplified here are preferably selected such that, in the case where the display panel is curved at an angle from 180° to 0°, tension is applied to the end portion of the protection cover 12 at least in a range of the angle greater than or equal to 90° and less than or equal to 180°.

Specific Example of Display Device

Figure 11:
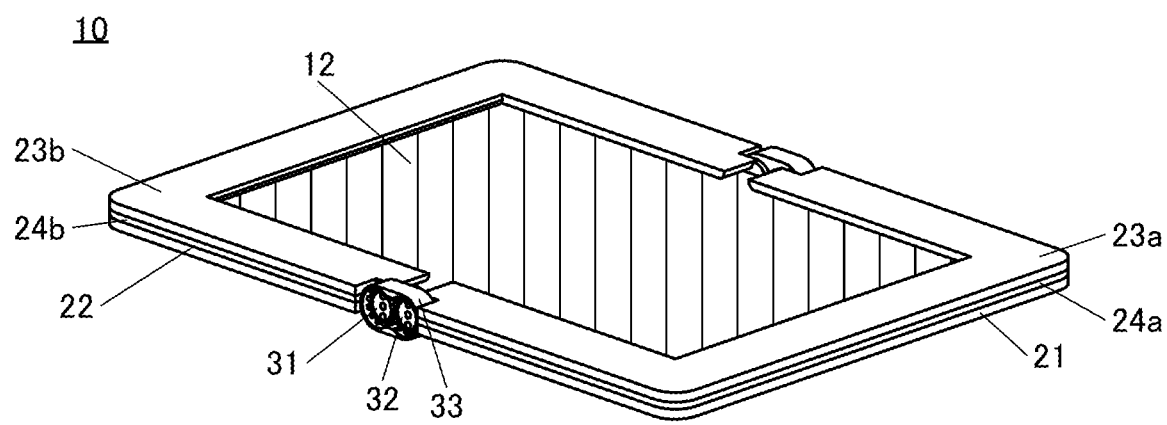
FIG. 11 is a view illustrating a structure example of a display device.
Figure 12A:
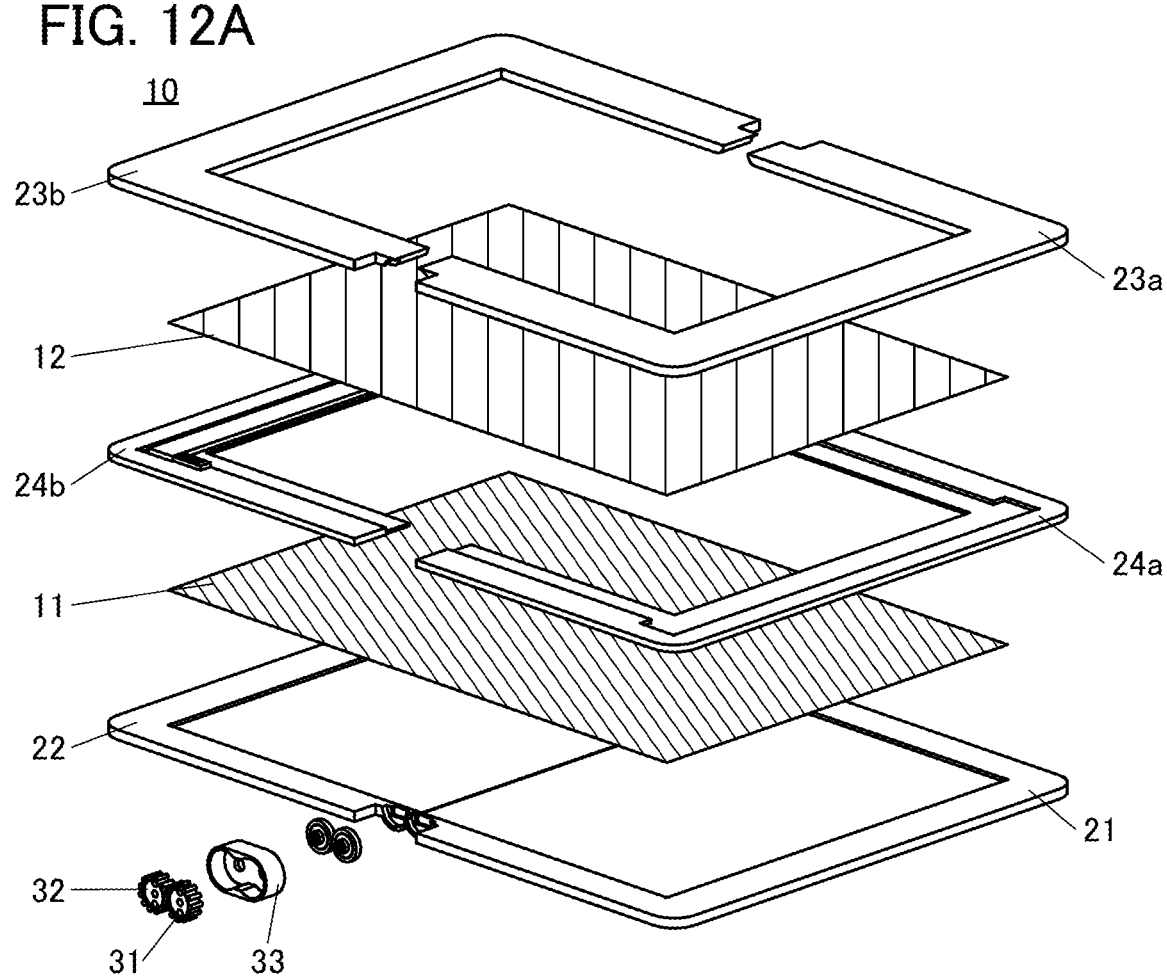
FIG. 12A and FIG. 12B are views illustrating a structure example of a display device.

A specific structure example of the display device is described below. FIG. 11 shows a schematic perspective view of the display device 10. FIG. 12A shows a schematic perspective view, where the display device 10 illustrated in FIG. 11 is disassembled into components.

As illustrated in FIG. 11 and FIG. 12A, the display device 10 includes the support 21, the support 22, a retention member 23a, a retention member 23b, a spacer 24a, a spacer 24b, the gear 31, the gear 32, the protection cover 12, and the display panel 11.

Part of the display panel 11 is interposed between the support 21 and the spacer 24a, and another part is interposed between the support 22 and the spacer 24b. The display panel 11 is bonded to the support 21 and the support 22 with a low-viscosity adhesion sheet.

Part of the protection cover 12 is interposed between the spacer 24a and the retention member 23a, and another part is interposed between the spacer 24b and the retention member 23a. The protection cover 12 is retained to be slidable between the spacer 24a and the retention member 23a and between the spacer 24b and the retention member 23a.

The gear 31 and the gear 32 are attached to the support 21 and the support 22, respectively. Furthermore, the gear 31 and the gear 32 are covered with a cover 33.

Figure 12B:
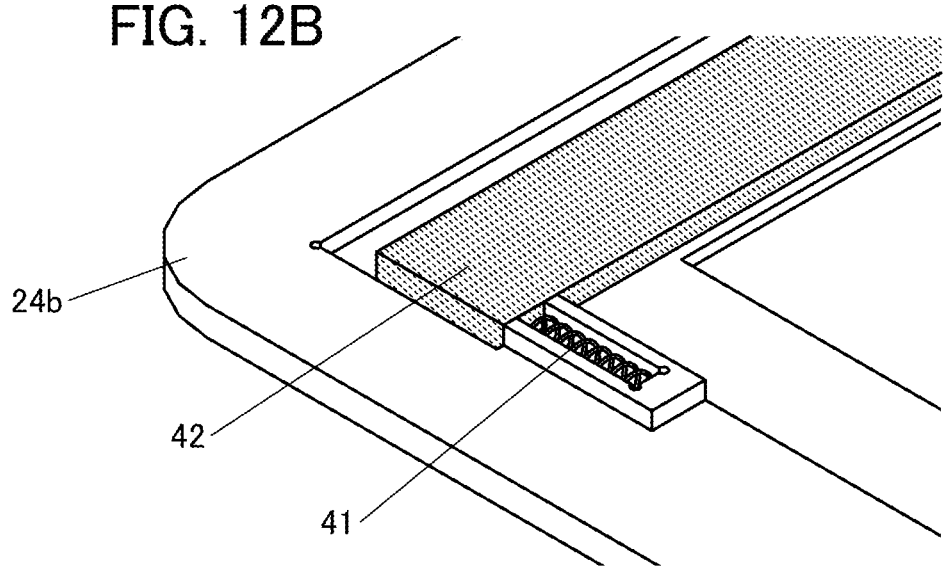

FIG. 12B shows an enlarged view of an end portion of the spacer 24b. In the spacer 24b, a concave portion for placing the spring 41 is provided. In addition, the spacer 24b is provided with the movable member 42. The spring 41 in a state of being compressed from its equilibrium length is placed in the concave portion. One side of the concave portion on the movable member 42 side is cut such that an end of the spring 41 is provided in contact with the movable member 42. The protection cover 12 can be attached to the top surface of the movable member 42 with an adhesive material or the like.

The spacer 24a, the spacer 24b, the retention member 23a, and the retention member 23b overlap a non-display region of the display panel 11, and have a U-shape top surface so as not to overlap with the display portion. In the region surrounded by the pair of retention members 23a and 23b, an image displayed on the display portion 15 of the display panel 11 can be seen through the protection cover 12 by a user.

The above is the description of the structure example of the display device 10.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 2

In this embodiment, a structure example of a display panel which can be applied to the display device of one embodiment of the present invention is described.

Structure Example

Figure 13:
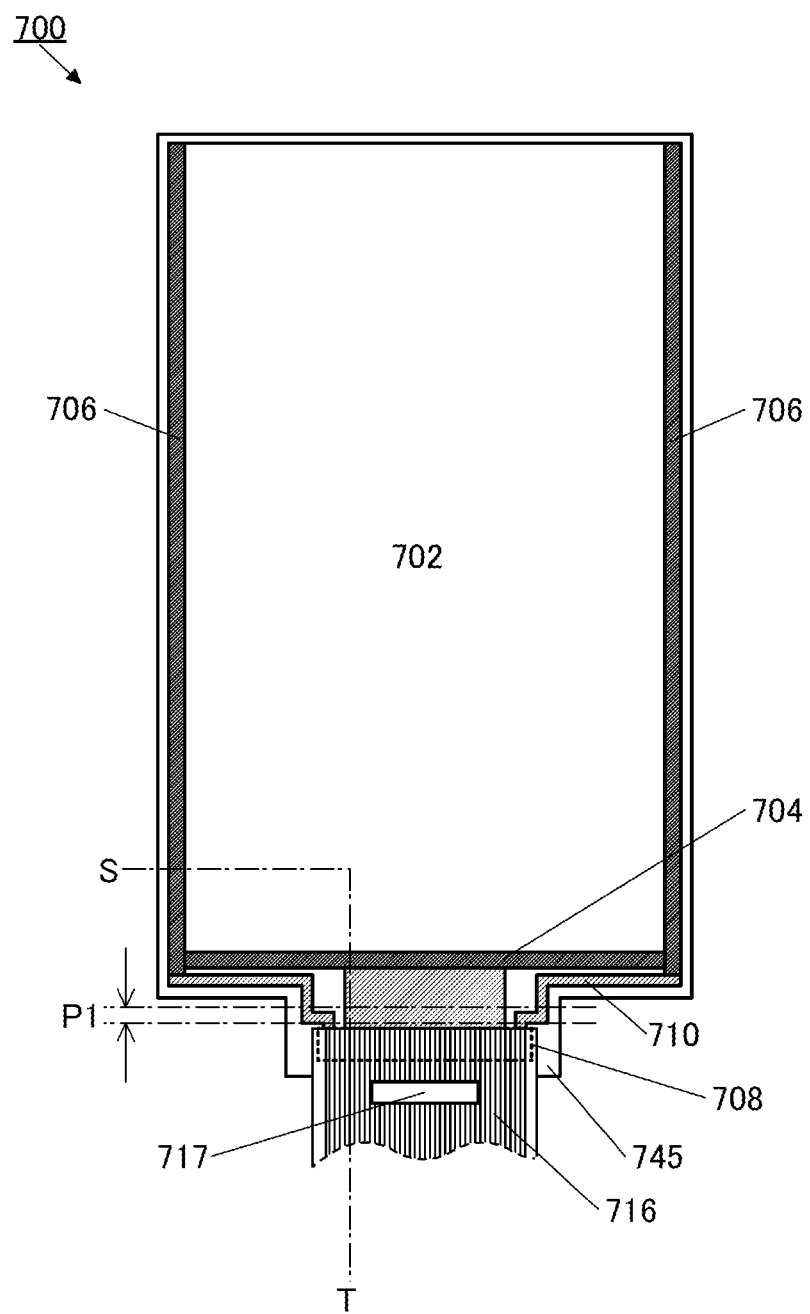
FIG. 13 is a view illustrating a structure example of a display panel.

FIG. 13 shows a top view of a display panel 700. The display panel 700 employs a support substrate 745 having flexibility and can be used as a flexible display. The display panel 700 includes a pixel portion 702 provided over the support substrate 745 having flexibility. Over the support substrate 745, a source driver circuit portion 704, a pair of gate driver circuit portions 706, a wiring 710, and the like are provided. A plurality of display elements are provided in the pixel portion 702.

Part of the support substrate 745 is provided with an FPC terminal portion 708, to which an FPC 716 (FPC: Flexible printed circuit) is connected. The pixel portion 702, the source driver circuit portion 704, and the gate driver circuit portions 706 are each supplied with a variety of signals and the like from the FPC 716 through the FPC terminal portion 708 and the wiring 710.

The pair of gate driver circuit portions 706 is provided on opposite sides with the pixel portion 702 interposed therebetween. Note that the gate driver circuit portions 706 and the source driver circuit portion 704 may be formed separately on semiconductor substrates or the like to form packaged IC chips. The IC chip can be mounted on the support substrate 745 by a COF (Chip On Film) technique or the like.

Transistors including an oxide semiconductor are preferably used as the transistor included in the pixel portion 702, the source driver circuit portion 704, and the gate driver circuit portions 706.

Light-emitting elements or the like can be used as the display elements in the pixel portion 702. Examples of light-emitting elements are self-luminous light-emitting elements such as an LED (Light Emitting Diode), an OLED (Organic LED), a QLED (Quantum-dot LED), and a semiconductor laser. As the display elements, a liquid crystal elements such as transmissive liquid crystal elements, reflective liquid crystal elements, or transflective liquid crystal elements can also be used. MEMS (Micro Electro Mechanical Systems) shutter elements, optical interference type MEMS elements, or display elements using a microcapsule method, an electrophoretic method, an electrowetting method, an Electronic Liquid Powder (registered trademark) method, or the like can also be used, for example.

FIG. 13 shows an example where the FPC terminal portion 708 is provided in the portion of the support substrate 745 which has a protrusive shape. In a region P1 in FIG. 13, part of the support substrate 745 that includes the FPC terminal portion 708 can be bent backwards. Bending the part of the support substrate 745 backwards enables the FPC 716 to be placed in a state overlapping with the rear side of the pixel portion 702 when the display panel 700 is mounted on an electronic device or the like, whereby the electronic device or the like can be space-saving or small-sized.

An IC 717 is mounted on the FPC 716 connected to the display panel 700. The IC 717 has a function of a source driver circuit, for example. In this case, a structure can be employed in which the source driver circuit portion 704 in the display device 700 includes at least one of a protection circuit, a buffer circuit, a demultiplexer circuit, and the like.

Cross-sectional Structure Example

Figure 14:
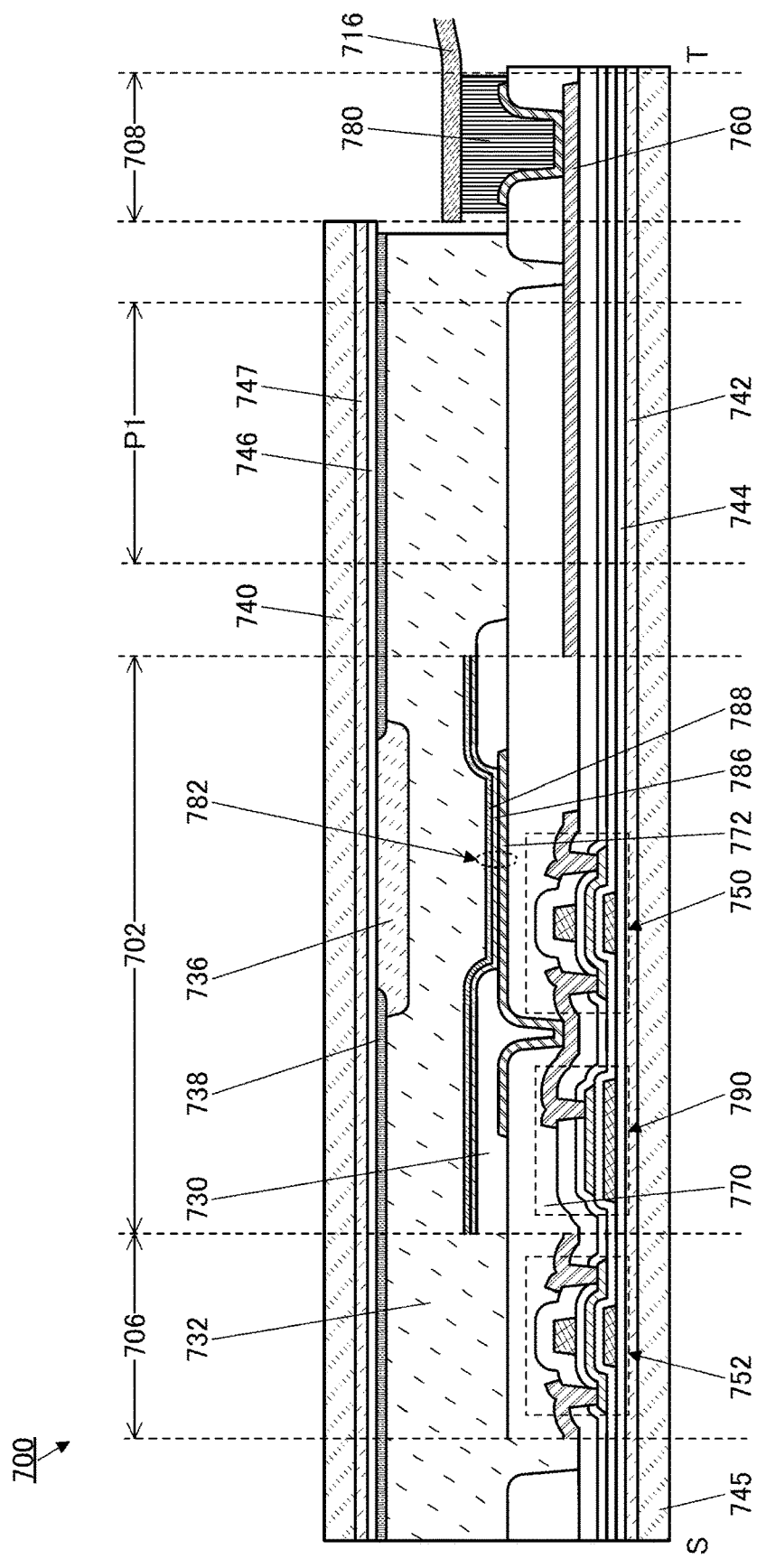
FIG. 14 is a view illustrating a structure example of a display panel.
Figure 15:
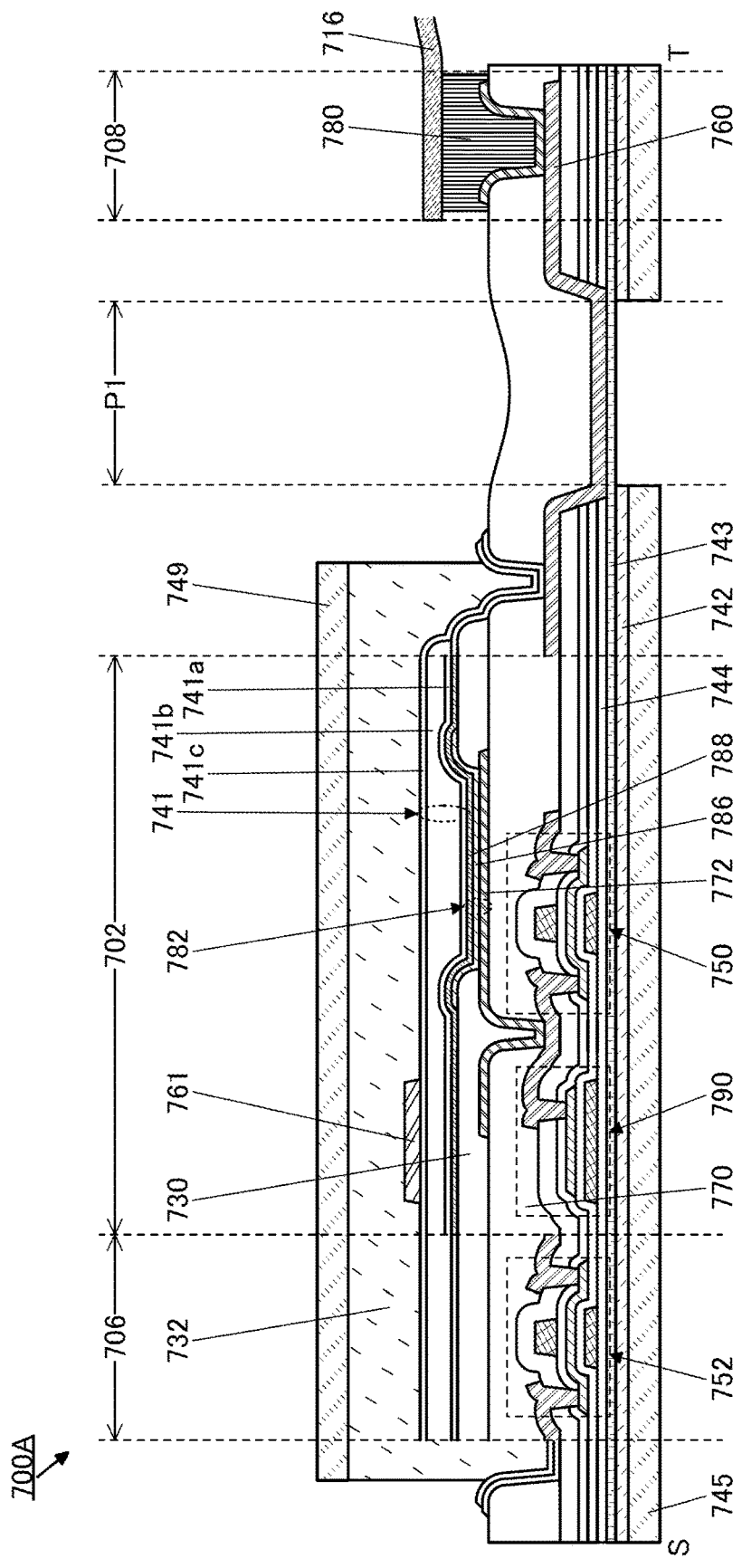
FIG. 15 is a view illustrating a structure example of a display panel.

Structures using an organic EL element as the display element are described below with reference to FIG. 14 and FIG. 15. FIG. 14 and FIG. 15 are each a schematic cross-sectional view of the display panel 700 illustrated in FIG. 13 along the dash-dot line S-T.

First, portions common to the display panels illustrated in FIG. 14 and FIG. 15 are described.

FIG. 14 and FIG. 15 illustrate cross sections including the pixel portion 702, the gate driver circuit portion 706, and the FPC terminal portion 708. The pixel portion 702 includes a transistor 750 and a capacitor 790. The gate driver circuit portion 706 includes a transistor 752.

The transistor 750 and the transistor 752 are transistors using an oxide semiconductor for a semiconductor layer in which a channel is formed. Note that the transistors are not limited thereto, and a transistor using silicon (amorphous silicon, polycrystalline silicon, or single-crystal silicon) or a transistor using an organic semiconductor for the semiconductor layer can be used.

The transistors used in this embodiment includes a highly purified oxide semiconductor film in which formation of oxygen vacancies is suppressed. The off-state current of the transistors can be reduced significantly. Accordingly, in the pixel employing such a transistor, the retention time of an electrical signal such as an image signal can be extended, and the interval between writes of an image signal or the like can also be set longer. Accordingly, the frequency of refresh operations can be reduced, so that power consumption can be reduced.

In addition, the transistor used in this embodiment can have relatively high field-effect mobility and thus is capable of high-speed operation. For example, with such a transistor capable of high-speed operation used for the display panel, a switching transistor in a pixel portion and a driver transistor used in a driver circuit portion can be formed over one substrate. That is, a structure in which a driver circuit formed using a silicon wafer or the like is not used is possible, in which case the number of components of the display device can be reduced. Moreover, the use of the transistor capable of high-speed operation also in the pixel portion can provide a high-quality image.

The capacitor 790 includes a lower electrode formed by processing the same film as a film used for the first gate electrode of the transistor 750 and an upper electrode formed by processing the same metal oxide film as a film used for the semiconductor layer. The resistance of the upper electrode is reduced as well as those of a source region and a drain region of the transistor 750. Part of an insulating film functioning as a first gate insulating layer of the transistor 750 is provided between the lower electrode and the upper electrode. That is, the capacitor 790 has a stacked-layer structure in which an insulating film functioning as a dielectric film is positioned between a pair of electrodes. A wiring obtained by processing the same film as a film used for a source electrode and a drain electrode of the transistor 750 is connected to the upper electrode.

A planarization insulating layer 770 which functions as a planarization film is provided over the transistor 750, the transistor 752, and the capacitor 790.

The transistor 750 included in the pixel portion 702 and the transistor 752 included in the gate driver circuit portion 706 may have different structures. For example, a top-gate transistor may be used as one of the transistors, and a bottom-gate transistor may be used as the other. Note that t the same applies to the driver circuit portion 704, as in the gate driver circuit portion 706.

The FPC terminal portion 708 includes a wiring 760 part of which functions as a connection electrode, an anisotropic conductive film 780, and the FPC 716. The wiring 760 is electrically connected to a terminal included in the FPC 716 through the anisotropic conductive film 780. Here, the wiring 760 is formed using the same conductive film as the source electrode and the drain electrode of the transistor 750 and the like.

Next, the display panel 700 illustrated in FIG. 14 is described.

The display panel 700 illustrated in FIG. 14 includes the support substrate 745 and a support substrate 740. As the support substrate 745 and the support substrate 740, a glass substrate or a substrate having flexibility such as a plastic substrate can be used, for example.

The transistor 750, the transistor 752, the capacitor 790, and the like are provided over the insulating layer 744. The support substrate 745 and the insulating layer 744 are bonded to each other with the adhesive layer 742.

The display panel 700 includes a light-emitting element 782, a coloring layer 736, a light-blocking layer 738, and the like.

The light-emitting element 782 includes a conductive layer 772, an EL layer 786, and a conductive layer 788. The conductive layer 772 is electrically connected to the source electrode or the drain electrode included in the transistor 750. The conductive layer 772 is provided over the insulating layer 770 and functions as a pixel electrode. An insulating layer 730 is provided to cover an end portion of the conductive layer 772. Over the insulating layer 730 and the conductive layer 772, the EL layer 786 and the conductive layer 788 are stacked.

For the conductive layer 772, a material having a property of reflecting visible light can be used. For example, a material including aluminum, silver, or the like can be used. For the conductive layer 788, a material that transmits visible light can be used. For example, an oxide material including indium, zinc, tin, or the like is preferably used. Thus, the light-emitting element 782 is a top-emission light-emitting element, which emits light to the side opposite the formation surface (the support substrate 740 side).

The EL layer 786 includes an organic compound or an inorganic compound such as quantum dots. The EL layer 786 includes a light-emitting material that exhibits white light when current flows.

As the light-emitting material, a fluorescent material, a phosphorescent material, a thermally activated delayed fluorescence (TADF) material, an inorganic compound (e.g., a quantum dot material), or the like can be used. Examples of materials that can be used for quantum dots include a colloidal quantum dot material, an alloyed quantum dot material, a core-shell quantum dot material, and a core quantum dot material.

The light-blocking layer 738 and the coloring layer 736 are provided on one surface of an insulating layer 746. The coloring layer 736 is provided in a position overlapping with the light-emitting element 782. The light-blocking layer 738 is provided in a region not overlapping with the light-emitting element 782 in the pixel portion 702. The light-blocking layer 738 may also be provided to overlap with the gate driver circuit portion 706 or the like.

The support substrate 740 is bonded to the other surface of the insulating layer 746 with an adhesive layer 747. The support substrate 740 and the support substrate 745 are bonded to each other with a sealing layer 732.

Here, for the EL layer 786 included in the light-emitting element 782, a light-emitting material that exhibits white light emission is used. White light emission by the light-emitting element 782 is colored by the coloring layer 736 to be emitted to the outside. The EL layer 786 is provided for the whole pixels that exhibit different colors. The pixels provided with the coloring layer 736 transmitting any of red light (R), green light (G), and blue light (B) are arranged in a matrix in the pixel portion 702, whereby the display device 700 can perform full-color display.

A conductive film having a transmissive property and a reflective property may be used for the conductive layer 788. In this case, a microcavity structure is achieved between the conductive layer 772 and the conductive layer 788 such that light of a specific wavelength can be intensified to be emitted. Also in this case, an optical adjustment layer for adjusting an optical distance may be placed between the conductive layer 772 and the conductive layer 788 such that the thickness of the optical adjustment layer is different for a pixel of each color and accordingly the color purity of light emitted from each pixel can be increased.

Note that a structure in which the coloring layer 736 is not provided may be employed when the EL layer 786 is formed into an island shape for each pixel or into a stripe shape for each pixel column, i.e., the above optical adjustment layer is formed by separate coloring.

Here, an inorganic insulating film which functions as a barrier film having low permeability is preferably used for each of the insulating layer 744 and the insulating layer 746. With such a structure in which the light-emitting element 782, the transistor 750, and the like are interposed between the insulating layer 744 and the insulating layer 746, deterioration of them can be inhibited and a highly reliable display panel can be achieved.

In a display panel 700A illustrated in FIG. 15, a resin layer 743 is provided between the adhesive layer 742 and the insulating layer 744 illustrated in FIG. 14. A protection layer 749 is provided instead of the support substrate 740.

The resin layer 743 is a layer including an organic resin such as polyimide or acrylic. The insulating layer 744 includes an inorganic insulating film of silicon oxide, silicon oxynitride, silicon nitride, or the like. The resin layer 743 and the support substrate 745 are attached to each other with the bonding layer 742. The resin layer 743 is preferably thinner than the support substrate 745.

The protection layer 749 is attached to the sealing layer 732. A glass substrate, a resin film, or the like can be used as the protection layer 749. As the protection layer 749, an optical member such as a polarizing plate (including a circularly polarizing plate) or a scattering plate, an input device such as a touch sensor panel, or a structure in which two or more of the above are stacked may be employed.

The EL layer 786 included in the light-emitting element 782 is provided over the insulating layer 730 and the conductive layer 772 in an island shape. The EL layers 786 are formed separately so that respective subpixels emit light of different colors, whereby color display can be performed without use of the coloring layer 736.

A protection layer 741 is provided to cover the light-emitting element 782. The protection layer 741 has a function of preventing diffusion of impurities such as water into the light-emitting element 782. The protection layer 741 has a stacked-layer structure in which an insulating layer 741a, an insulating layer 741b, and an insulating layer 741c are stacked in this order from the conductive layer 788 side. In that case, it is preferable that inorganic insulating films with a high barrier property against impurities such as water be used as the insulating layer 741a and the insulating layer 741c, and an organic insulating film which functions as a planarization film be used as the insulating layer 741b. The protection layer 741 is preferably provided to extend also to the gate driver circuit portion 706.

An organic insulating film covering the transistor 750, the transistor 752, and the like is preferably formed in an island shape inward from the sealing layer 732. In other words, an end portion of the organic insulating film is preferably inward from the sealing layer 732 or in a region overlapping with an end portion of the sealing layer 732. FIG. 15 shows an example in which the insulating layer 770, the insulating layer 730, and the insulating layer 741b are processed into island shapes. The insulating layer 741c and the insulating layer 741a are provided in contact with each other in a portion overlapping with the sealing layer 732, for example. Thus, a surface of the organic insulating film covering the transistor 750 and the transistor 752 is not exposed to the outside of the sealing layer 732, whereby diffusion of water or hydrogen from the outside to the transistor 750 and the transistor 752 through the organic insulating film can be favorably prevented. This can reduce variations in electrical characteristics of the transistors, so that a display device with extremely high reliability can be achieved.

In FIG. 15, the region P1 that can be bent includes a portion where the support substrate 745, the bonding layer 742, and the inorganic insulating film such as the insulating layer 744 are not provided. The region P1 has a structure in which the insulating layer 770 including an organic material covers the wiring 760 not to expose the wiring 760. When an inorganic insulating film is not provided in the region P1 that can be bent and only a conductive layer including a metal or an alloy and a layer including an organic material are stacked, generation of cracks at the time of bending can be prevented. When the support substrate 745 is not provided in the region P1, part of the display panel 700A can be bent with an extremely small radius of curvature.

In FIG. 15, a conductive layer 761 is provided over the protection layer 741. The conductive layer 761 can be used as a wiring or an electrode.

In the case where a touch sensor is provided so as to overlap with the display panel 700A, the conductive layer 761 can function as an electrostatic shielding film for preventing transmission of electrical noise to the touch sensor during pixel driving. In this case, the structure in which a predetermined constant potential is applied to the conductive layer 761 can be employed.

Alternatively, the conductive layer 761 can be used as an electrode of the touch sensor, for example. This enables the display panel 700A to function as a touch panel. For example, the conductive layer 761 can be used as an electrode or a wiring of a capacitive touch sensor. In this case, the conductive layer 761 can be used as a wiring or an electrode to which a sensor circuit is connected or a wiring or an electrode to which a sensor signal is input. When the touch sensor is formed over the light-emitting element 782 in this manner, the number of components can be reduced, and manufacturing cost of an electronic device or the like can be reduced.

The conductive layer 761 is preferably provided in a portion not overlapping with the light-emitting element 782. The conductive layer 761 can be provided in a position overlapping with the insulating layer 730, for example. Thus, a transparent conductive film with a relatively low conductivity is not necessarily used for the conductive layer 761, and a metal or an alloy having high conductivity or the like can be used, so that the sensitivity of the sensor can be increased.

As the type of the touch sensor that can be formed of the conductive layer 761, a variety of types such as a capacitive type, a resistive type, a surface acoustic wave type, an infrared type, an optical type, and a pressure-sensitive type can be used, without limitation to a capacitive type. Alternatively, two or more of these types may be combined and used.

[Components]

Components such as a transistor that can be used in the display device will be described below.

[Transistor]

The transistors each include a conductive layer functioning as a gate electrode, a semiconductor layer, a conductive layer functioning as a source electrode, a conductive layer functioning as a drain electrode, and an insulating layer functioning as a gate insulating layer.

Note that there is no particular limitation on the structure of the transistor included in the display device of one embodiment of the present invention. For example, a planar transistor, a staggered transistor, or an inverted staggered transistor may be used. A top-gate or bottom-gate transistor structure may be employed. Gate electrodes may be provided above and below a channel.

There is no particular limitation on the crystallinity of a semiconductor material used for the transistors, and any of an amorphous semiconductor, a single crystal semiconductor, and a semiconductor having crystallinity other than the single crystal (a microcrystalline semiconductor, a polycrystalline semiconductor, or a semiconductor partly including crystal regions) may be used. It is preferable that a single crystal semiconductor or a semiconductor having crystallinity be used, in which case deterioration of the transistor characteristics can be suppressed.

In particular, a transistor that uses a metal oxide film for a semiconductor layer where a channel is formed will be described below.

As a semiconductor material used for the transistors, a metal oxide whose energy gap is greater than or equal to 2 eV, preferably greater than or equal to 2.5 eV, further preferably greater than or equal to 3 eV can be used. A typical example thereof is a metal oxide containing indium, and for example, a CAC-OS described later or the like can be used.

A transistor using a metal oxide having a wider band gap and a lower carrier density than silicon has a low off-state current; thus, charges accumulated in a capacitor that is connected in series with the transistor can be held for a long time.

The semiconductor layer can be, for example, a film represented by an In-M-Zn-based oxide that contains indium, zinc, and M (M is a metal such as aluminum, titanium, gallium, germanium, yttrium, zirconium, lanthanum, cerium, tin, neodymium, or hafnium).

In the case where the metal oxide contained in the semiconductor layer is an In-M-Zn-based oxide, it is preferable that the atomic ratio of metal elements of a sputtering target used for forming a film of the In-M-Zn oxide satisfy In M and Zn M The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the formed semiconductor layer varies from the above atomic ratio of metal elements of the sputtering target in a range of ±40%.

A metal oxide film with a low carrier density is used as the semiconductor layer. For example, for the semiconductor layer, a metal oxide whose carrier density is lower than or equal to $1\times10^{17}$/cm$^3$, preferably lower than or equal to $1\times10^{15}$/cm$^3$, further preferably lower than or equal to $1\times10^{13}$/cm$^3$, still further preferably lower than or equal to $1\times10^{11}$/cm$^3$, even further preferably lower than $1\times10^{10}$/cm$^3$, and higher than or equal to $1\times10^{-9}$/cm$^3$ can be used. Such a metal oxide is referred to as a highly purified intrinsic or substantially highly purified intrinsic metal oxide. The metal oxide has a low impurity concentration and a low density of defect states and can thus be referred to as a metal oxide having stable characteristics.

Note that, without limitation to those described above, an oxide semiconductor with an appropriate composition may be used in accordance with required semiconductor characteristics and electrical characteristics (e.g., field-effect mobility and threshold voltage) of the transistor. To obtain the required semiconductor characteristics of the transistor, it is preferable that the carrier density, the impurity concentration, the density of defect states, the atomic ratio between a metal element and oxygen, the interatomic distance, the density, and the like of the semiconductor layer be set to appropriate values.

When silicon or carbon, which is one of Group 14 elements, is contained in the metal oxide contained in the semiconductor layer, oxygen vacancies are increased in the semiconductor layer, and the semiconductor layer becomes n-type. Thus, the concentration of silicon or carbon (concentration obtained by secondary ion mass spectrometry) in the semiconductor layer is set to lower than or equal to $2 \times 10^{18}$ atoms/cm$^3$, preferably lower than or equal to $2 \times 10^{17}$ atoms/cm$^3$.

Alkali metal and alkaline earth metal might generate carriers when bonded to a metal oxide, in which case the off-state current of the transistor might be increased. Thus, the concentration of alkali metal or alkaline earth metal of the semiconductor layer, which is obtained by secondary ion mass spectrometry, is set to lower than or equal to $1 \times 10^{18}$ atoms/cm$^3$, preferably lower than or equal to $2 \times 10^{16}$ atoms/cm$^3$.

When nitrogen is contained in the metal oxide contained in the semiconductor layer, electrons serving as carriers are generated and the carrier density increases, so that the semiconductor layer easily becomes n-type. As a result, a transistor including a metal oxide that contains nitrogen is likely to have normally-on characteristics. Hence, the nitrogen concentration obtained by secondary ion mass spectrometry is preferably set to lower than or equal to $5 \times 10^{18}$ atoms/cm$^3$.

Oxide semiconductors are classified into a single crystal oxide semiconductor and a non-single-crystal oxide semiconductor. Examples of the non-single-crystal oxide semiconductor include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The aforementioned non-single-crystal oxide semiconductor or CAC-OS can be suitably used for a semiconductor layer of a transistor disclosed in one embodiment of the present invention. As the non-single-crystal oxide semiconductor, the nc-OS or the CAAC-OS can be suitably used.

The semiconductor layer may be a mixed film including two or more of a region of a CAAC-OS, a region of a polycrystalline oxide semiconductor, a region of an nc-OS, a region of an a-like OS, and a region of an amorphous oxide semiconductor. The mixed film has, for example, a single-layer structure or a stacked-layer structure including two or more of the above regions in some cases.

A CAC-OS (Cloud-Aligned Composite oxide semiconductor) is preferably used for a semiconductor layer of a transistor disclosed in one embodiment of the present invention. The use of the CAC-OS allows the transistor to have high electrical characteristics or high reliability.

<Composition of CAC-OS>

The composition of a CAC (Cloud-Aligned Composite)-OS that can be used in a transistor disclosed in one embodiment of the present invention will be described below.

A CAC-OS refers to one composition of a material in which elements constituting a metal oxide are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in a metal oxide is hereinafter referred to as a mosaic pattern or a patch-like pattern.

Note that the metal oxide preferably contains at least indium. In particular, indium and zinc are preferably contained. In addition, one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, a CAC-OS in an In—Ga—Zn oxide (of the CAC-OS, an In—Ga—Zn oxide may be particularly referred to as CAC-IGZO) has a composition (hereinafter, also referred to as cloud-like composition) in which materials are separated into indium oxide (hereinafter, InO$_{X1}$ (X1 is a real number greater than 0)) or indium zinc oxide (hereinafter, In$_{X2}$Zn$_{Y2}$O$_{Z2}$ (X2, Y2, and Z2 are real numbers greater than 0)), and gallium oxide (hereinafter, GaO$_{X3}$ (X3 is a real number greater than 0)) or gallium zinc oxide (hereinafter, Ga$_{X4}$Zn$_{Y4}$O$_{Z4}$ (X4, Y4, and Z4 are real numbers greater than 0)) to form a mosaic pattern, and InO$_{X1}$ or In$_{X2}$Zn$_{Y2}$O$_{Z2}$ forming the mosaic pattern is evenly distributed in the film.

That is, the CAC-OS is a composite metal oxide having a composition in which a region including GaO$_{X3}$ as a main component and a region including In$_{X2}$Zn$_{Y2}$O$_{Z2}$ or InO$_{X1}$ as a main component are mixed. Note that in this specification, for example, when the atomic ratio of In to an element M in a first region is greater than the atomic ratio of In to the element M in a second region, the first region has higher In concentration than the second region.

Note that IGZO is a common name, which may specify a compound containing In, Ga, Zn, and O. A typical example is a crystalline compound represented by InGaO$_3$(ZnO)$_{m1}$ (m1 is a natural number) or In$_{(1+x0)}$Ga$_{(1-x0)}$O$_3$(ZnO)$_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

Meanwhile, the CAC-OS relates to the material composition of a metal oxide. The CAC-OS refers to a composition in which, in the material composition containing In, Ga, Zn, and O, some regions that contain Ga as a main component and are observed as nanoparticles and some regions that contain In as a main component and are observed as nanoparticles are randomly dispersed in a mosaic pattern. Therefore, the crystal structure is a secondary element for the CAC-OS.

Note that in the CAC-OS, a stacked-layer structure including two or more films with different compositions is not included. For example, a two-layer structure of a film containing In as a main component and a film containing Ga as a main component is not included.

A boundary between the region containing GaO$_{X3}$ as a main component and the region containing In$_{X2}$Zn$_{Y2}$O$_{Z2}$ or InO$_{X1}$ as a main component is not clearly observed in some cases.

In the case where one or more kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, nanoparticle regions containing the selected metal element(s) as a main component are observed in part of a CAC-OS and nanoparticle regions containing In as a main component are observed in part of the CAC-OS, and these nanoparticle regions are randomly dispersed to form a mosaic pattern.

The CAC-OS can be formed by a sputtering method under a condition where a substrate is intentionally not heated, for example. Moreover, in the case of forming the CAC-OS by a sputtering method, any one or more selected from an inert gas (typically, argon), an oxygen gas, and a nitrogen gas are used as a deposition gas. The flow rate of the oxygen gas to the total flow rate of the deposition gas in deposition is preferably as low as possible, and for example, the flow rate of the oxygen gas is higher than or equal to 0% and lower than 30%, preferably higher than or equal to 0% and lower than or equal to 10%.

The CAC-OS is characterized in that a clear peak is not observed when measurement is conducted using a θ/2θ scan by an Out-of-plane method, which is an X-ray diffraction (XRD) measurement method. That is, it is found from X-ray diffraction measurement that no alignment in the a-b plane direction and the c-axis direction is observed in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes an nc (nano-crystal) structure with no alignment in the plan-view direction and the cross-sectional direction.

Moreover, for example, it can be checked by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a composition different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are phase-separated from each other to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through the regions including $In_{X2}Zn_{Y2}O_{Z2}$ or $InO_{X1}$ as a main component, the conductivity of a metal oxide is exhibited. Accordingly, when the regions including $In_{X2}Zn_{Y2}O_{Z2}$ or $InO_{X1}$ as a main component are distributed in a metal oxide like a cloud, high field-effect mobility (μ) can be achieved.

By contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in a metal oxide, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

A semiconductor element using a CAC-OS has high reliability. Thus, the CAC-OS is suitably used in a variety of semiconductor devices typified by a display.

Since a transistor including a CAC-OS in a semiconductor layer has high field-effect mobility and high driving capability, the use of the transistor in a driver circuit, typically a scan line driver circuit that generates a gate signal, enables a display device with a narrow frame width (also referred to as a narrow bezel) to be provided. Furthermore, the use of the transistor in a signal line driver circuit included in the display device (particularly in a demultiplexer connected to an output terminal of a shift register included in a signal line driver circuit) can reduce the number of wirings connected to the display device.

Furthermore, unlike a transistor including low-temperature polysilicon, the transistor including a CAC-OS in the semiconductor layer does not need a laser crystallization step. Thus, the manufacturing cost of a display device can be reduced, even when the display device is formed using a large substrate. In addition, the transistor including a CAC-OS in the semiconductor layer is preferably used for a driver circuit and a display unit in a large display device having high resolution such as ultra-high definition ("4K resolution", "4K2K", and "4K") or super high definition ("8K resolution", "8K4K", and "8K"), in which case writing can be performed in a short time and display defects can be reduced.

Alternatively, silicon may be used for a semiconductor in which a channel of a transistor is formed. As silicon, amorphous silicon may be used but silicon having crystallinity is particularly preferably used. For example, microcrystalline silicon, polycrystalline silicon, or single crystal silicon are preferably used. In particular, polycrystalline silicon can be formed at a temperature lower than that for single crystal silicon and has higher field-effect mobility and higher reliability than amorphous silicon.

[Conductive Layer]

Examples of materials that can be used for conductive layers of a variety of wirings and electrodes and the like included in the display device in addition to a gate, a source, and a drain of a transistor include metals such as aluminum, titanium, chromium, nickel, copper, yttrium, zirconium, molybdenum, silver, tantalum, and tungsten and an alloy containing such a metal as its main component. A single-layer structure or stacked-layer structure including a film containing any of these materials can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which an aluminum film or a copper film is stacked over a titanium film or a titanium nitride film and a titanium film or a titanium nitride film is formed thereover, a three-layer structure in which an aluminum film or a copper film is stacked over a molybdenum film or a molybdenum nitride film and a molybdenum film or a molybdenum nitride film is formed thereover, and the like can be given. Note that an oxide such as indium oxide, tin oxide, or zinc oxide may be used. Copper containing manganese is preferably used because it increases controllability of a shape by etching.

[Insulating Layer]

Examples of an insulating material that can be used for the insulating layers include, in addition to a resin such as acrylic or epoxy and a resin having a siloxane bond, an inorganic insulating material such as silicon oxide, silicon oxynitride, silicon nitride oxide, silicon nitride, or aluminum oxide.

The light-emitting element is preferably provided between a pair of insulating films with low water permeability. In that case, impurities such as water can be inhibited from entering the light-emitting element, and thus a decrease in the reliability of the display device can be inhibited.

Examples of the insulating film with low water permeability include a film containing nitrogen and silicon, such as a silicon nitride film and a silicon nitride oxide film, and a film containing nitrogen and aluminum, such as an aluminum nitride film. Alternatively, a silicon oxide film, a silicon oxynitride film, an aluminum oxide film, or the like may be used.

For example, the moisture vapor transmission rate of the insulating film with low water permeability is lower than or equal to $1\times10^{-5}$ [g/(m²·day)], preferably lower than or equal to $1\times10^{-6}$ [g/(m²·day)], further preferably lower than or equal to $1\times10^{-7}$ [g/(m²·day)], still further preferably lower than or equal to $1\times10^{-8}$ [g/(m²·day)].

The above is the description of the components.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 3

In this embodiment, configuration examples of a display device will be described with reference to FIG. 16A to FIG. 16C.

Figure 16A:
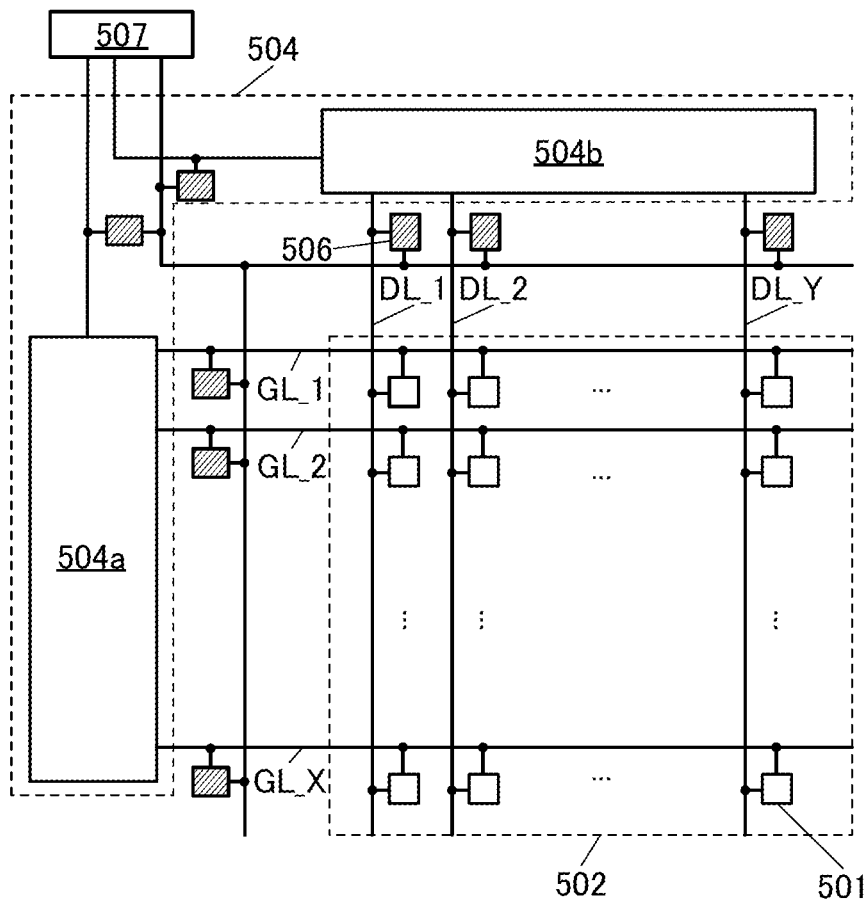
FIG. 16A is a block diagram of a display device.

The display device illustrated in FIG. 16A includes a pixel portion 502, a driver circuit portion 504, protection circuits 506, and a terminal portion 507. Note that a configuration in which the protection circuits 506 are not provided may be employed.

The pixel portion 502 includes a plurality of pixel circuits 501 that drive a plurality of display elements arranged in X rows and Y columns (X and Y each independently represent a natural number of 2 or more).

The driver circuit portion 504 includes driver circuits such as a gate driver 504a that outputs a scanning signal to gate lines GL_1 to GL_X and a source driver 504b that supplies a data signal to data lines DL_1 to DL_Y. The gate driver 504a includes at least a shift register. The source driver 504b is formed using a plurality of analog switches, for example. Alternatively, the source driver 504b may be formed using a shift register or the like.

The terminal portion 507 refers to a portion provided with terminals for inputting power, control signals, image signals, and the like to the display device from external circuits.

The protection circuit 506 is a circuit that, when a potential out of a certain range is applied to a wiring to which the protection circuit 506 is connected, establishes continuity between the wiring and another wiring. The protection circuit 506 illustrated in FIG. 16A is connected to a variety of wirings such as the gate lines GL that are wirings between the gate driver 504a and the pixel circuits 501 and the data lines DL that are wirings between the source driver 504b and the pixel circuits 501, for example. Note that the protection circuits 506 are hatched in FIG. 16A to distinguish the protection circuits 506 from the pixel circuits 501.

The gate driver 504a and the source driver 504b may be provided over a substrate over which the pixel portion 502 is provided, or a substrate where a gate driver circuit or a source driver circuit is separately formed (e.g., a driver circuit board formed using a single crystal semiconductor or a polycrystalline semiconductor) may be mounted on the substrate over which the pixel portion 502 is provided by COG or TAB (Tape Automated Bonding).

Figure 16B:
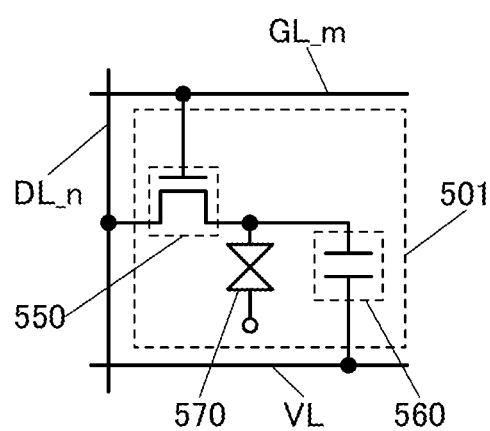
FIG. 16B and FIG. 16C are circuit diagrams of a pixel.
Figure 16C:
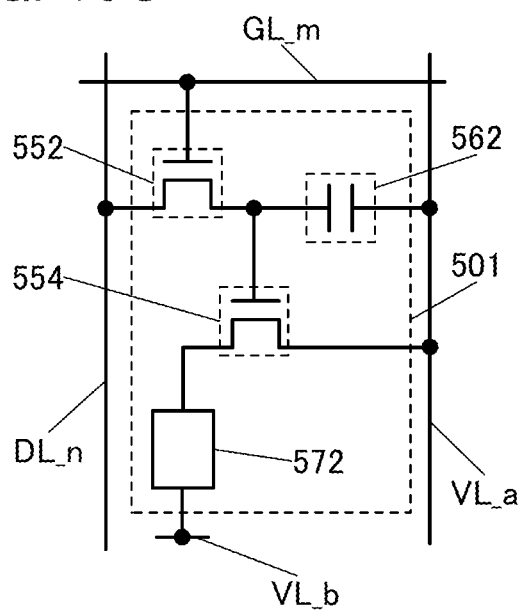

The plurality of pixel circuits 501 illustrated in FIG. 16A can have a configuration illustrated in FIG. 16B or FIG. 16C, for example.

The pixel circuit 501 illustrated in FIG. 16B includes a liquid crystal element 570, a transistor 550, and a capacitor 560. The data line DL_n, the gate line GL_m, a potential supply line VL, and the like are connected to the pixel circuit 501.

The potential of one of a pair of electrodes of the liquid crystal element 570 is set appropriately in accordance with the specifications of the pixel circuit 501. The alignment state of the liquid crystal element 570 is set depending on written data. Note that a common potential may be supplied to one of the pair of electrodes of the liquid crystal element 570 included in each of the plurality of pixel circuits 501. Moreover, a different potential may be supplied to one of the pair of electrodes of the liquid crystal element 570 of the pixel circuit 501 in each row.

The pixel circuit 501 illustrated in FIG. 16C includes a transistor 552, a transistor 554, a capacitor 562, and a light-emitting element 572. The data line DL_n, the gate line GL_m, a potential supply line VL_a, a potential supply line VL_b, and the like are connected to the pixel circuit 501.

Note that a high power supply potential VDD is supplied to one of the potential supply line VL_a and the potential supply line VL_b, and a low power supply potential VSS is supplied to the other. Current flowing through the light-emitting element 572 is controlled in accordance with a potential applied to a gate of the transistor 554, whereby the luminance of light emitted from the light-emitting element 572 is controlled.

At least part of the configuration examples, the drawings corresponding thereto, and the like exemplified in this embodiment can be implemented in combination with the other configuration examples, the other drawings, and the like as appropriate.

At least part of this embodiment can be implemented in combination with the other embodiments described in this specification as appropriate.

Embodiment 4

A pixel circuit including a memory for correcting gray levels of pixels and a display device including the pixel circuit will be described below.

[Circuit Configuration]

Figure 17A:
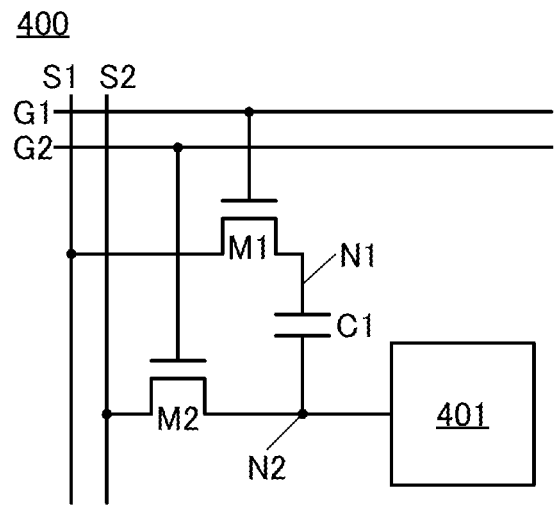
FIG. 17A, FIG. 17C, and FIG. 17D are circuit diagrams of a display device.

FIG. 17A shows a circuit diagram of a pixel circuit 400. The pixel circuit 400 includes a transistor M1, a transistor M2, a capacitor C1, and a circuit 401. A wiring S1, a wiring S2, a wiring G1, and a wiring G2 are connected to the pixel circuit 400.

In the transistor M1, a gate is connected to the wiring G1, one of a source and a drain is connected to the wiring S1, and the other is connected to one electrode of the capacitor C1. In the transistor M2, a gate is connected to the wiring G2, one of a source and a drain is connected to the wiring S2, and the other is connected to the other electrode of the capacitor C1 and the circuit 401.

The circuit 401 is a circuit including at least one display element. Any of a variety of elements can be used as the display element, and typically, a light-emitting element such as an organic EL element or an LED element, a liquid crystal element, a MEMS (Micro Electro Mechanical Systems) element, or the like can be used.

A node connecting the transistor M1 and the capacitor C1 is denoted as a node N1, and a node connecting the transistor M2 and the circuit 401 is denoted as a node N2.

In the pixel circuit 400, the potential of the node N1 can be retained when the transistor M1 is turned off. The potential of the node N2 can be retained when the transistor M2 is turned off. When a predetermined potential is written to the node N1 through the transistor M1 with the transistor M2 being in an off state, the potential of the node N2 can be changed in accordance with a change in the potential of the node N1 owing to capacitive coupling through the capacitor C1.

Here, the transistor using an oxide semiconductor can be used as one or both of the transistor M1 and the transistor M2. Accordingly, owing to an extremely low off-state current, the potential of the node N1 or the node N2 can be retained for a long time. Note that in the case where the period in which the potential of each node is retained is short (specifically, the case where the frame frequency is higher than or equal to 30 Hz, for example), a transistor using a semiconductor such as silicon may be used.

Driving Method Example

Figure 17B:
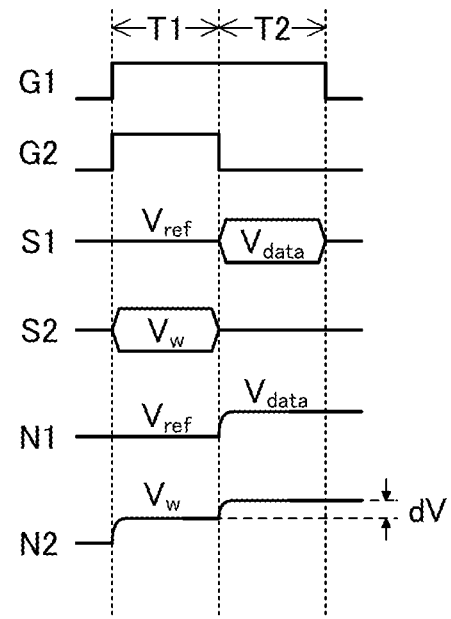
FIG. 17B is a timing chart.

Next, an example of a method of operating the pixel circuit 400 is described with reference to FIG. 17B. FIG. 17B is a timing chart of the operation of the pixel circuit 400. Note that for simplification of description, the influence of various kinds of resistance such as wiring resistance, parasitic capacitance of a transistor, a wiring, or the like, the threshold voltage of the transistor, and the like is not taken into account here.

In the operation shown in FIG. 17B, one frame period is divided into a period T1 and a period T2. The period T1 is a period in which a potential is written to the node N2, and the period T2 is a period in which a potential is written to the node N1.

[Period T1]

In the period T1, a potential for turning on the transistor is supplied to both the wiring G1 and the wiring G2. In addition, a potential $V_{ref}$ that is a fixed potential is supplied to the wiring S1, and a first data potential $V_w$ is supplied to the wiring S2.

The potential $V_{ref}$ is supplied from the wiring S1 to the node N1 through the transistor M1. The first data potential $V_w$ is supplied from the wiring S2 to the node N2 through the transistor M2. Accordingly, a potential difference $V_w - V_{ref}$ is retained in the capacitor C1.

[Period T2]

Next, in the period T2, a potential for turning on the transistor M1 is supplied to the wiring G1, and a potential for turning off the transistor M2 is supplied to the wiring G2. A second data potential Vaasa is supplied to the wiring S1. The wiring S2 may be supplied with a predetermined constant potential or brought into a floating state.

The second data potential $V_{data}$ is supplied from the wiring S1 to the node N1 through the transistor M1. At this time, capacitive coupling due to the capacitor C1 changes the potential of the node N2 in accordance with the second data potential $V_{data}$ by a potential dV. That is, a potential that is the sum of the first data potential $V_w$ and the potential dV is input to the circuit 401. Note that although dV is shown as a positive value in FIG. 17B, dV may be a negative value. That is, the second data potential $V_{data}$ may be lower than the potential $V_{ref}$.

Here, the potential dV is roughly determined by the capacitance of the capacitor C1 and the capacitance of the circuit 401. When the capacitance of the capacitor C1 is sufficiently larger than the capacitance of the circuit 401, the potential dV is a potential close to the second data potential $V_{data}$.

In the above manner, the pixel circuit 400 can generate a potential to be supplied to the circuit 401 including the display element, by combining two kinds of data signals; hence, a gray level can be corrected in the pixel circuit 400.

The pixel circuit 400 can also generate a potential exceeding the maximum potential that can be supplied by a source driver connected to the wiring S1 and the wiring S2. For example, in the case where a light-emitting element is used, high-dynamic range (HDR) display or the like can be performed. In the case where a liquid crystal element is used, overdriving or the like can be achieved.

Application Examples

Example Using Liquid Crystal Element

Figure 17C:
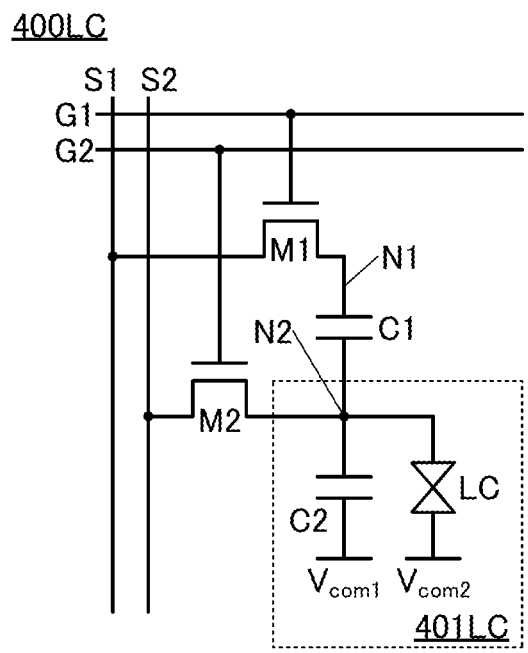

A pixel circuit 400LC illustrated in FIG. 17C includes a circuit 401LC. The circuit 401LC includes a liquid crystal element LC and a capacitor C2.

In the liquid crystal element LC, one electrode is connected to the node N2 and one electrode of the capacitor C2, and the other electrode is connected to a wiring supplied with a potential $V_{com2}$. The other electrode of the capacitor C2 is connected to a wiring supplied with a potential $V_{com1}$.

The capacitor C2 functions as a storage capacitor. Note that the capacitor C2 can be omitted when not needed.

In the pixel circuit 400LC, a high voltage can be supplied to the liquid crystal element LC; thus, high-speed display can be performed by overdriving or a liquid crystal material with a high driving voltage can be employed, for example. Moreover, by supply of a correction signal to the wiring S1 or the wiring S2, a gray level can be corrected in accordance with the operating temperature, the deterioration state of the liquid crystal element LC, or the like.

Example Using Light-Emitting Element

Figure 17D:
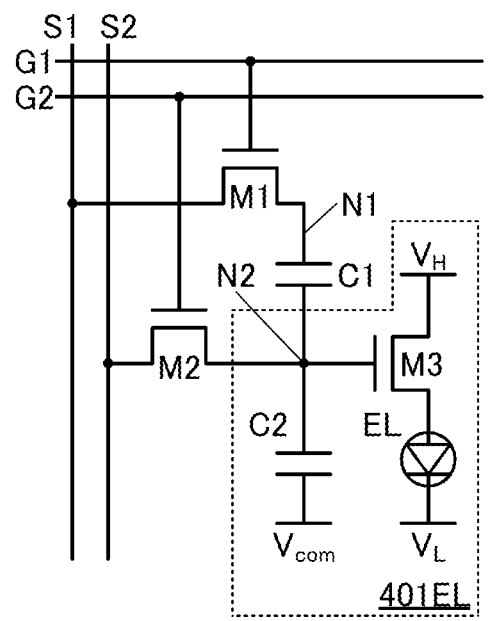

A pixel circuit 400EL illustrated in FIG. 17D includes a circuit 401EL. The circuit 401EL includes a light-emitting element EL, a transistor M3, and the capacitor C2.

In the transistor M3, a gate is connected to the node N2 and one electrode of the capacitor C2, one of a source and a drain is connected to a wiring supplied with a potential $V_H$, and the other is connected to one electrode of the light-emitting element EL. The other electrode of the capacitor C2 is connected to a wiring supplied with a potential $V_{com}$. The other electrode of the light-emitting element EL is connected to a wiring supplied with a potential $V_L$.

The transistor M3 has a function of controlling a current to be supplied to the light-emitting element EL. The capacitor C2 functions as a storage capacitor. The capacitor C2 can be omitted when not needed.

Note that although the configuration in which the anode side of the light-emitting element EL is connected to the transistor M3 is described here, the transistor M3 may be connected to the cathode side. In that case, the values of the potential $V_H$ and the potential $V_L$ can be appropriately changed.

In the pixel circuit 400EL, a large amount of current can flow through the light-emitting element EL when a high potential is applied to the gate of the transistor M3, which enables HDR display, for example. Moreover, a variation in the electrical characteristics of the transistor M3 and the light-emitting element EL can be corrected by supply of a correction signal to the wiring S1 or the wiring S2.

Note that the configuration is not limited to the circuits illustrated in FIG. 17C and FIG. 17D, and a configuration to which a transistor, a capacitor, or the like is further added may be employed.

At least part of this embodiment can be implemented in combination with the other embodiments described in this specification as appropriate.

Embodiment 5

In this embodiment, structure examples of the pixel of the display device of one embodiment of the present invention are described below.

Structure examples of a pixel 300 are shown in FIG. 18A to FIG. 18E.

The pixel 300 includes a plurality of pixels 301. The plurality of pixels 301 each function as a subpixel. One pixel 300 is formed of the plurality of pixels 301 exhibiting different colors, and thus full-color display can be achieved in a display unit.

Figure 18A:
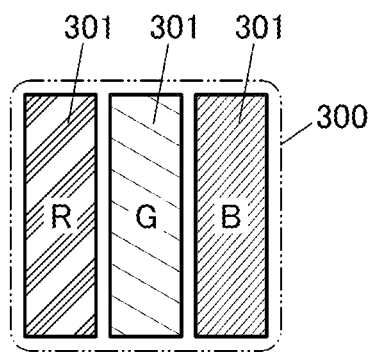
FIG. 18A to FIG. 18E are views illustrating structure examples of a pixel.
Figure 18B:
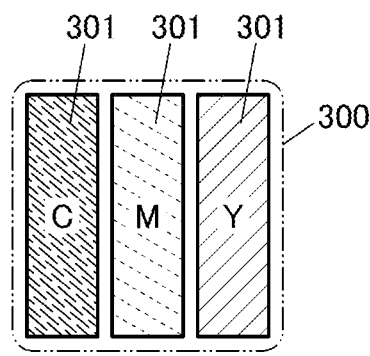

The pixels 300 illustrated in FIG. 18A and FIG. 18B each include three subpixels. The combination of colors exhibited by the pixels 301 included in the pixel 300 illustrated in FIG. 18A is red (R), green (G), and blue (B). The combination of colors exhibited by the pixels 301 included in the pixel 300 illustrated in FIG. 18B is cyan (C), magenta (M), and yellow (Y).

Figure 18C:
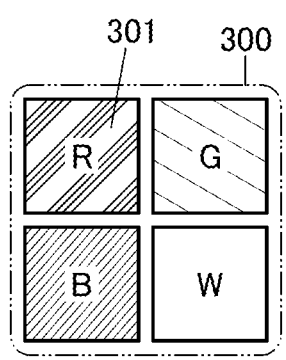
Figure 18D:
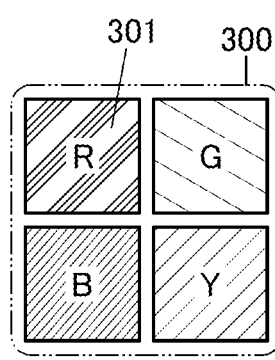
Figure 18E:
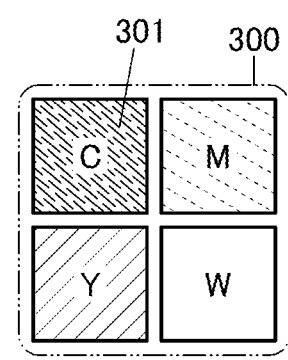

The pixels 300 illustrated in FIG. 18C to FIG. 18E each include four subpixels. The combination of colors exhibited by the pixels 301 included in the pixel 300 illustrated in FIG. 18C is red (R), green (G), blue (B), and white (W). The use of the subpixel that exhibits white can increase the luminance of the display unit. The combination of colors exhibited by the pixels 301 included in the pixel 300 illustrated in FIG. 18D is red (R), green (G), blue (B), and yellow (Y). The combination of colors exhibited by the pixels 301 included in the pixel 300 illustrated in FIG. 18E is cyan (C), magenta (M), yellow (Y), and white (W).

When subpixels that exhibit red, green, blue, cyan, magenta, yellow, and the like are combined as appropriate with more subpixels functioning as one pixel, the reproducibility of halftones can be increased. Thus, the display quality can be improved.

The display device of one embodiment of the present invention can reproduce the color gamut of various standards. For example, the display device of one embodiment of the present invention can reproduce the color gamut of the following standards: the PAL (Phase Alternating Line) or NTSC (National Television System Committee) standard used for TV broadcasting; the sRGB (standard RGB) or Adobe RGB standard used widely for display devices in electronic devices such as personal computers, digital cameras, and printers; the ITU-R BT.709 (International Telecommunication Union Radiocommunication Sector Broadcasting Service (Television) 709) standard used for HDTV (High Definition Televisions), also referred to Hi-Vision); the DCI-P3 (Digital Cinema Initiatives P3) standard used for digital cinema projection; and the ITU-R BT.2020 (REC.2020 (Recommendation 2020)) standard used for UHDTV (Ultra High Definition Television, also referred to as Super Hi-Vision); and the like.

Using the pixels 300 arranged in a matrix of 1920×1080, a display device that can achieve full color display with a resolution of what is called full high definition (also referred to as "2K resolution", "2K1K", "2K", or the like) can be obtained. For example, using the pixels 300 arranged in a matrix of 3840×2160, a display device that can achieve full color display with a resolution of what is called ultra high definition (also referred to as "4K resolution", "4K2K", "4K", or the like) can be obtained. For example, using the pixels 300 arranged in a matrix of 7680×4320, a display device that can achieve full color display with a resolution of what is called super high definition (also referred to as "8K resolution", "8K4K", "8K", or the like) can be obtained. By increasing the number of pixels 300, a display device that can achieve full color display with 16K or 32K resolution can be achieved.

At least part of this embodiment can be implemented in combination with the other embodiments described in this specification as appropriate.

REFERENCE NUMERALS

10: display device, 11: display panel, 12: protection cover, 12a, 12b, 13: functional layer, 14: protection cover, 14a, 14b: functional layer, 15: display portion, 21, 22: support, 23, 23a, 23b: retention member, 24, 24a, 24b: spacer, 28: region, 29: stylus, 31, 32: gear, 31a, 32a: rotation axis, 33: cover, 41, 41a, 41b: spring, 42: movable member, 43: adhesive member This application is based on Japanese Patent Application Serial No. 2018-163032 filed with Japan Patent Office on Aug. 31, 2018, the entire contents of which are hereby incorporated herein by reference.

The invention claimed is:

1. A display device comprising a display panel and a protection cover,
    wherein the display panel comprises a first portion having flexibility,
    wherein the protection cover has a light-transmitting property and flexibility and is provided to overlap with a display surface side of the display panel,
    wherein the display device is configured to be reversibly changed in shape to a first mode and a second mode,
    wherein in the first mode, the display panel and the protection cover are each substantially flat,
    wherein in the second mode, the first portion of the display panel is curved so that the display surface side becomes a concave surface, and part of the protection cover is curved in the same direction as the first portion, and
    wherein in the second mode, there is a gap between the first portion and the protection cover.

2. The display device according to claim 1,
    wherein the display panel and the protection cover are provided in contact with each other in the first mode.

3. The display device according to claim 1,
    wherein the display panel and the protection cover are provided apart from each other in the first mode.

4. The display device according to claim 3, further comprising a functional layer having flexibility between the display panel and the protection cover,
    wherein part of the functional layer is curved in the same direction as the first portion in the second mode, and wherein the functional layer is configured to serve as a touch panel or a circularly polarizing plate.

5. The display device according to claim 1,
wherein the protection cover is configured to serve as a touch panel or a circularly polarizing plate.

6. The display device according to claim 1,
wherein the display panel further comprises a second portion and a third portion,
wherein the first portion is positioned between the second portion and the third portion,
wherein the second portion and the third portion are substantially flat in the second mode, and
wherein, in the protection cover, a portion overlapping with the second portion and a portion overlapping with the third portion each comprise a substantially flat region.

7. The display device according to claim 6,
wherein an angle formed between a surface of the second portion and a surface of the third portion is an angle θ, and
wherein the display device further comprises, in a range of the angle θ greater than or equal to 90° and less than 180°, an angle range in which the protection cover is changed in shape so that a distance between an end portion of the second portion or an end portion of the third portion of the display panel and an end portion of the protection cover increases continuously when the angle θ is gradually reduced from 180°.

8. The display device according to claim 6,
wherein an angle formed between a surface of the second portion and a surface of the third portion is an angle θ,
wherein the display device further comprises, in a range of the angle θ greater than or equal to 90° and less than 180°, an angle range in which a curvature radius of the first portion is smaller than a curvature radius of a curved portion of the protection cover; and
wherein the display device further comprises, in a range of the angle θ greater than or equal to 0° and less than 90°, an angle range in which the curvature radius of the first portion is larger than the curvature radius of the curved portion of the protection cover.

9. The display device according to claim 6,
wherein an angle formed between a surface of the second portion and a surface of the third portion is an angle θ, and
wherein the display device further comprises, in a range of the angle θ greater than or equal to 90° and less than 180°, an angle range in which a distance between the first portion and the protection cover increases continuously when the angle θ is gradually reduced from 180°.

10. The display device according to claim 6,
wherein an angle formed between a surface of the second portion and a surface of the third portion is an angle θ, and
wherein in the protection cover, tension is applied in a direction perpendicular to a pair of end portions intersecting with a curving direction, in a range of the angle θ greater than or equal to 90° and less than or equal to 180°.

11. The display device according to claim 6, further comprising a first support fixed to the second portion and a second support fixed to the third portion,
wherein the first portion is not fixed to either the first support or the second support.

12. The display device according to claim 11,
wherein one of the pair of end portions of the protection cover, which intersect with the curving direction, is fixed to the first support, and the other of the pair of end portions is not fixed to either the first support or the second support.

13. The display device according to claim 11,
wherein the first support comprises a first rotation axis perpendicular to the curving direction of the second portion,
wherein the second support comprises a second rotation axis parallel to the first rotation axis,
wherein the first support and the second support are capable of rotating in opposite directions at the same angle upon the first rotation axis and the second rotation axis, respectively, and
wherein relative positions of the first rotation axis and the second rotation axis are constant.

14. The display device according to claim 11,
wherein the first support and the second support each comprise a retention member, and
wherein the protection cover is slidably attached to the retention member.

15. The display device according to claim 1,
wherein the protection cover comprises one or more of a urethane resin, an acrylic resin, and a silicone resin.

* * * * *